US010984982B2

(12) United States Patent
Nagasaka

(10) Patent No.: US 10,984,982 B2
(45) Date of Patent: Apr. 20, 2021

(54) CHARGED PARTICLE BEAM OPTICAL APPARATUS, EXPOSURE APPARATUS, EXPOSURE METHOD, CONTROL APPARATUS, CONTROL METHOD, INFORMATION GENERATION APPARATUS, INFORMATION GENERATION METHOD AND DEVICE MANUFACTURING METHOD

(71) Applicant: NIKON CORPORATION, Tokyo (JP)

(72) Inventor: Hiroyuki Nagasaka, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 37 days.

(21) Appl. No.: 16/492,683

(22) PCT Filed: Mar. 16, 2017

(86) PCT No.: PCT/JP2017/010734
§ 371 (c)(1),
(2) Date: Oct. 3, 2019

(87) PCT Pub. No.: WO2018/167922
PCT Pub. Date: Sep. 20, 2018

(65) Prior Publication Data
US 2020/0051780 A1 Feb. 13, 2020

(51) Int. Cl.
H01J 37/304 (2006.01)
G03F 7/20 (2006.01)
(Continued)

(52) U.S. Cl.
CPC .............. H01J 37/304 (2013.01); G03F 7/20 (2013.01); G03F 7/70025 (2013.01);
(Continued)

(58) Field of Classification Search
CPC .. H01J 37/304; H01J 37/3174; H01J 37/3177; H01J 2237/30461;
(Continued)

(56) References Cited

U.S. PATENT DOCUMENTS 5,448,075 A 9/1995 Fueki et al.
2005/0253093 A1* 11/2005 Gorski et al. ......... H01J 37/302
250/492.22
(Continued)

FOREIGN PATENT DOCUMENTS

JP H01-307222 A 12/1989
JP H07-142316 A 6/1995
(Continued)

OTHER PUBLICATIONS

Jun. 6, 2017 International Search Report issued in International Patent Application No. PCT/JP2017/010734.
(Continued)

Primary Examiner — Kiet T Nguyen
(74) Attorney, Agent, or Firm — Oliff PLC

(57) ABSTRACT

A charged particle beam optical apparatus has a plurality of irradiation optical systems each of which irradiates an object with a charged particle beam and a first control apparatus configured to control a second irradiation optical system on the basis of an operation state of a first irradiation optical system.

32 Claims, 15 Drawing Sheets

(51) Int. Cl.
*H01J 37/317* (2006.01)
*H01L 21/027* (2006.01)

(52) U.S. Cl.
CPC ........ *H01J 37/3174* (2013.01); *H01L 21/027* (2013.01); *H01J 2237/0216* (2013.01); *H01J 2237/3045* (2013.01); *H01J 2237/31771* (2013.01); *H01J 2237/31774* (2013.01)

(58) Field of Classification Search
CPC ....... H01J 2237/3045; H01J 2237/0216; H01J 2237/31771; H01J 2237/31774; G03F 7/70025; G03F 7/20; H01L 21/027
USPC ........................................ 250/492.22, 492.23
See application file for complete search history.

(56) References Cited

U.S. PATENT DOCUMENTS

| | | |
|---|---|---|
| 2013/0056647 A1 | 3/2013 | Yoshikawa et al. |
| 2016/0133438 A1 | 5/2016 | Yamada et al. |
| 2018/0067402 A1* | 3/2018 | Yamada et al. ........... G03F 7/20 250/492.22 |
| 2019/0198293 A1* | 6/2019 | Ogasawara ........... H01L 37/317 250/492.22 |

FOREIGN PATENT DOCUMENTS

| | | |
|---|---|---|
| JP | 2002-151399 A | 5/2002 |
| JP | 2002-158156 A | 5/2002 |
| JP | 2002-260988 A | 9/2002 |
| JP | 2007-329220 A | 12/2007 |
| JP | 2013-055144 A | 3/2013 |

OTHER PUBLICATIONS

Jun. 6, 2017 Written Opinion of the International Searching Authority issued in International Patent Application No. PCT/JP2017/010734.

* cited by examiner

| $dP_{i,i-12}=0.01nm$ | $dP_{i,i-11}=0.015nm$ | $dP_{i,i-10}=0.025nm$ | $dP_{i,i-9}=0.01nm$ | $dP_{i,i-8}=0.01nm$ |
|---|---|---|---|---|
| ☐ | ☐ | ▨ | ☐ | ☐ |
| $EA_{i-12}$ | $EA_{i-11}$ | $EA_{i-10}$ | $EA_{i-9}$ | $EA_{i-8}$ |
| $(EB_{i-12})$ | $(EB_{i-11})$ | $(EB_{i-10})$ | $(EB_{i-9})$ | $(EB_{i-8})$ |

| $dP_{i,i-7}=0.01nm$ | $dP_{i,i-6}=0.1nm$ | $dP_{i,i-5}=0.4nm$ | $dP_{i,i-4}=0.1nm$ | $dP_{i,i-3}=0.015nm$ |
|---|---|---|---|---|
| ☐ | ▨ | ▨ | ▨ | ☐ |
| $EA_{i-7}$ | $EA_{i-6}$ | $EA_{i-5}$ | $EA_{i-4}$ | $EA_{i-3}$ |
| $(EB_{i-7})$ | $(EB_{i-6})$ | $(EB_{i-5})$ | $(EB_{i-4})$ | $(EB_{i-3})$ |

| $dP_{i,i-2}=0.03nm$ | $dP_{i,i-1}=0.4nm$ | | $dP_{i,i+1}=0.4nm$ | $dP_{i,i+2}=0.03nm$ |
|---|---|---|---|---|
| ▨ | ▨ | ■ | ▨ | ▨ |
| $EA_{i-2}$ | $EA_{i-1}$ | $EA_i$ | $EA_{i+1}$ | $EA_{i+2}$ |
| $(EB_{i-2})$ | $(EB_{i-1})$ | $(EB_i)$ | $(EB_{i+1})$ | $(EB_{i+2})$ |

| $dP_{i,i+3}=0.015nm$ | $dP_{i,i+4}=0.1nm$ | $dP_{i,i+5}=0.4nm$ | $dP_{i,i+6}=0.1nm$ | $dP_{i,i+7}=0.015nm$ |
|---|---|---|---|---|
| ☐ | ▨ | ▨ | ▨ | ☐ |
| $EA_{i+3}$ | $EA_{i+4}$ | $EA_{i+5}$ | $EA_{i+6}$ | $EA_{i+7}$ |
| $(EB_{i+3})$ | $(EB_{i+4})$ | $(EB_{i+5})$ | $(EB_{i+6})$ | $(EB_{i+7})$ |

| $dP_{i,i+8}=0.01nm$ | $dP_{i,i+9}=0.015nm$ | $dP_{i,i+10}=0.03nm$ | $dP_{i,i+11}=0.015nm$ | $dP_{i,i+12}=0.01nm$ |
|---|---|---|---|---|
| ☐ | ☐ | ▨ | ☐ | ☐ |
| $EA_{i+8}$ | $EA_{i+9}$ | $EA_{i+10}$ | $EA_{i+11}$ | $EA_{i+12}$ |
| $(EB_{i+8})$ | $(EB_{i+9})$ | $(EB_{i+10})$ | $(EB_{i+11})$ | $(EB_{i+12})$ |

FIG. 15

CHARGED PARTICLE BEAM OPTICAL APPARATUS, EXPOSURE APPARATUS, EXPOSURE METHOD, CONTROL APPARATUS, CONTROL METHOD, INFORMATION GENERATION APPARATUS, INFORMATION GENERATION METHOD AND DEVICE MANUFACTURING METHOD

TECHNICAL FIELD

The present invention relates to a charged particle beam optical apparatus that is configured to irradiate an object with a charged particle beam, an exposure apparatus having a charged particle beam optical apparatus, an exposure method of exposing an object by using an exposure apparatus, a control apparatus and a control method for controlling a charged particle beam optical apparatus, an information generation apparatus and an information generation method for generating an information used to control an exposure apparatus and a device manufacturing method for manufacturing a device by using an exposure method, for example.

BACKGROUND ART

An exposure apparatus that is configured to use a charged particle beam (for example, an electron beam) as an exposure beam is proposed as an exposure apparatus used in a lithography process to manufacture a device such as a semiconductor element. For example, a Patent Literature 1 discloses an exposure apparatus having a plurality of column parts each of which is configured to irradiate an object such as a substrate with the electron beam.

There is a possibility that the electron beam irradiated by one column part is influenced by the electron beam irradiated by another column part in the exposure apparatus having the plurality of column parts. Thus, there is a possibility that an exposure accuracy deteriorates when an influence from the electron beam irradiated by another column part to the electron beam irradiated by one column part is not considered.

CITATION LIST

Patent Literature

Patent Literature 1: US2016/0133438A1

SUMMARY OF INVENTION

A first aspect provides a charged particle beam optical apparatus that is configured to irradiate an object with a charged particle beam, the charged particle beam optical apparatus is provided with: a plurality of irradiation optical systems each of which is configured to irradiate the object with the charged particle beam; and a first control apparatus that is configured to control, on the basis of an operation state of at least one first irradiation optical system of the plurality of irradiation optical systems, a second irradiation optical system of the plurality of irradiation optical systems that is different from the first irradiation optical system.

A second aspect provides an exposure apparatus that is provided with the above described charged particle beam optical apparatus in the first aspect of the present invention.

A third aspect provides an exposure method of exposing the object by using the above described exposure apparatus in the second aspect of the present invention.

A fourth aspect provides an exposure method of exposing an object by irradiating a charged particle beam, the exposure method includes: irradiating the object with the charged particle beam through each of a plurality of irradiation optical systems; and controlling, on the basis of an operation state of at least one first irradiation optical system of the plurality of irradiation optical systems, a second irradiation optical system of the plurality of irradiation optical systems that is different from the first irradiation optical system.

A fifth aspect provides a control apparatus for controlling a charged particle beam optical apparatus that is configured to irradiate an object with a charged particle beam from each of a plurality of irradiation optical systems, the control apparatus is configured to control, on the basis of an operation state of at least one first irradiation optical system of the plurality of irradiation optical systems, a second irradiation optical system of the plurality of irradiation optical systems that is different from the first irradiation optical system.

A sixth aspect provides a control method of controlling a charged particle beam optical apparatus that is configured to irradiate an object with a charged particle beam from each of a plurality of irradiation optical systems, the control method includes controlling, on the basis of an operation state of at least one first irradiation optical system of the plurality of irradiation optical systems, a second irradiation optical system of the plurality of irradiation optical systems that is different from the first irradiation optical system.

A seventh aspect provides an information generation apparatus that is provided with a second control apparatus that is configured to generate the control information used by the above described charged particle beam optical apparatus provided by the first aspect of the present invention to control the second irradiation optical system.

An eighth aspect provides an information generation method of generating the control information used by the above described charged particle beam optical apparatus provided by the first aspect of the present invention to control the second irradiation optical system.

A ninth aspect provides a device manufacturing method including a lithography step, the object is exposed by the above described exposure method in the third or fourth aspect of the present invention in the lithography step.

An operation and another advantage of the present invention will be apparent from an embodiment described below.

BRIEF DESCRIPTION OF DRAWINGS

FIG. 15 is a planar view that illustrates a misalignment amount of a certain irradiation area with the electron beam causes the misalignment amount.

DESCRIPTION OF EMBODIMENTS

Hereinafter, with reference to drawings, an embodiment of a charged particle beam optical apparatus, an exposure apparatus, an exposure method, a control apparatus, a control method, an information generation apparatus, an information generation method and a device manufacturing method will be described. In the below described description, the embodiment of a charged particle beam optical apparatus, an exposure apparatus, an exposure method, a control apparatus, a control method, an information generation apparatus, an information generation method and a device manufacturing method will be described by using an exposure system SYS that is provided with an exposure apparatus (namely, an electron beam exposure apparatus) EX that is configured to expose a wafer W by irradiating the wafer W with an electron beam EB. The exposure apparatus EX may expose the wafer W to draw a pattern on the wafer W by the electron beam EB and may expose the wafer W to transfer a pattern of a micro mask to the wafer W by the electron beam EB.

Moreover, in the below described description, a positional relationship of various components that constitute the exposure system SYS will be described by using an XYZ rectangular coordinate system that is defined by a X axis, a Y axis and a Z axis that are perpendicular to one another. Note that each of an X axis direction and a Y axis direction is a horizontal direction (namely, a predetermined direction in a horizontal plane) and a Z axis direction is a vertical direction (namely, a direction that is perpendicular to the horizontal plane, and substantially an up-down direction), for the purpose of simple description. Note that the Z axis direction is also a direction that is parallel to an optical axis AX of each of a plurality of below described electron beam optical systems 12 of the exposure apparatus EX. Moreover, rotational directions (in other words, inclination directions) around the X axis, the Y axis and the Z axis are referred to as a θX direction, a θY direction and a θZ direction, respectively.

(1) Structure of Exposure System SYS

Firstly, with reference to FIG. 1 to FIG. 6, a structure of the exposure system SYS will be described.

(1-1) Overall Structure of Exposure System SYS

Figure 1:
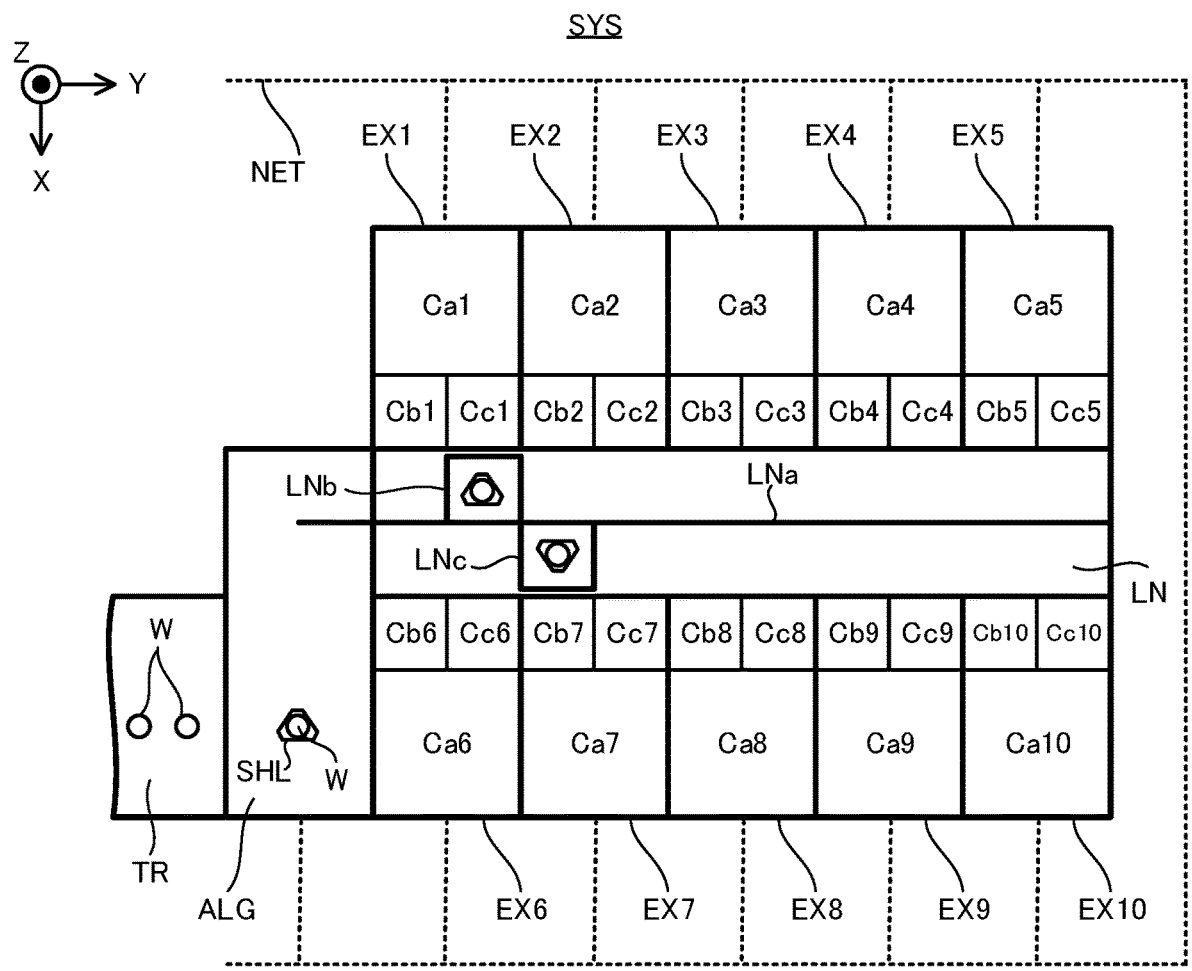
FIG. 1 is a top view that illustrates an overall structure of an exposure system.

Firstly, with reference to FIG. 1, an overall structure of the exposure system SYS will be described. FIG. 1 is a top view that illustrates the overall structure of the exposure system SYS.

As illustrated in FIG. 1, the exposure system SYS is provided with a plurality of exposure apparatuses EX. In an example illustrated in FIG. 1, the exposure system SYS is provided with ten exposure apparatuses EX (specifically, the exposure apparatus EX1 to the exposure apparatus EX10). The exposure apparatus EX1 to the exposure apparatus EX5 are arranged in line along a predetermined arrangement direction (the Y axis direction in the example illustrated in FIG. 1). The exposure apparatus EX6 to the exposure apparatus EX10 are arranged in parallel with the exposure apparatus EX1 to the exposure apparatus EX5 in line along a predetermined arrangement direction (the Y axis direction in the example illustrated in FIG. 1).

Each exposure apparatus EX is provided with an exposure chamber Ca, a load chamber Cb and an unload chamber Cc. Namely, the exposure apparatus EXq (note that q is an integer value from 1 to 10) is provided with the exposure chamber Caq, the load chamber Cbq and the unload chamber Ccq.

Each of the exposure chamber Ca, the load chamber Cb and the unload chamber Cc is configured to evacuate an inner space therein so that the inner space becomes a vacuum space. The exposure chamber Ca generates a vacuum space in which the electron beam EB is irradiated to the wafer W to expose the wafer W. The load chamber Cb generates a vacuum space for loading (namely, carrying in) the wafer W from an outside of the exposure chamber Ca to an inside of the exposure chamber Ca. The unload chamber Cc generates a vacuum space for unloading (namely, carrying out) the wafer W from the inside of the exposure chamber Ca to the outside of the exposure chamber Ca.

The wafer W is a semiconductor substrate on which an electron beam resist (alternatively, any photosensitive agent or sensitive member) is coated. The wafer W is a circular-plate-like substrate having a diameter of 300 mm and a thickness of 700 micrometer to 800 micrometer, for example. However, the wafer W may be a substrate having any shape and any size. A plurality of quadrangular shot areas S are allowed to be set on the wafer W, wherein the plurality of shot areas S are exposed by a plurality of electron beams EB, respectively, irradiated by the plurality of below described electron beam optical systems 12 of the exposure apparatus EX. For example, when the size of one shot area S is 26 mm×33 mm, 100 shot areas S are allowed to be set on the wafer W. Note that the shot area S at least one portion of which is missing may be set on the wafer W.

The exposure system SYS is further provided with a transport track TR via which the wafer W on which the electron beam resist is coated is transported from and/or to a not-illustrated coater/developer with an in-line method and an alignment apparatus ALG that executes an alignment of the wafer W carried in the exposure system SYS via the transport track TR. The alignment apparatus ALG receives the wafer W carried via the transport track TR by using a not-illustrated transport arm. Then, the alignment apparatus ALG mounts the wafer W in a shuttle SHL that is a holding member for holding the wafer W by using the not-illustrated transport arm. A concave part for mounting the wafer W is formed on a surface of the shuttle SHL. The wafer W is fixed in the concave part of the shuttle SHL by a vacuum suction or an electrostatic suction. As a result, the wafer W is held by the shuttle SHL. In the subsequent step, the wafer W is transported in the exposure system SYS in a state where the wafer W is held by the shuttle SHL. Thus, the exposure system SYS is provided with a transport line LN for transporting the shuttle SHL holding the wafer W in the exposure system SYS. Note that the alignment apparatus ALG and the transport line LN (moreover, a not-illustrated apparatus disposed in a space other than the inner space of each of the exposure chamber Ca, the load chamber Cb and the unload chamber Cc) may be disposed in an atmospheric pressure environment.

The alignment apparatus ALG executes the alignment of the wafer W held by the shuttle SHL. In order to execute the alignment, the alignment apparatus ALG is provided with a stage, a stage position measurement apparatus, a mark detect apparatus and a signal processing apparatus, for example. The stage is movable along at least one of the X axis direction, the Y axis direction, the Z axis direction, the θX direction, the θY direction and the θZ direction while holding the shuttle SHL that holds the wafer W. The stage position measurement apparatus measures the position of the stage. The mark detect apparatus detects an alignment mark AM formed on a scribe line between the plurality of shot areas S on the surface of the wafer W (moreover, a not-illustrated index (for example, an index mark that is formed on an index plate disposed in the alignment apparatus ALG), if needed). The alignment mark AM is a two-dimensional grating including a grating pattern formed to arrange in the X axis direction and a grating pattern formed to arrange in the Y axis direction, for example. The detection of the alignment mark AM may be a detection based on an image processing method (for example, FIA (Field Image Alignment) method) or may be a detection based on a diffracted light interference method. The signal processing apparatus calculates a position (for example, a position in a stage coordinate system) of the alignment mark AM on the basis of a detection result of the mark detect apparatus and a measurement result of the stage position measurement apparatus. Moreover, the signal processing apparatus executes a calculation based on an EGA (Enhanced Global Alignment) method on the basis of a calculation result of the position of the alignment mark AM, for example. As a result, the signal processing apparatus calculates a relationship between an actual position of the alignment mark AM and a designed position of the alignment mark AM (namely, a relationship between an actual position of the shot area S and a designed position of the shot area S). The result of the alignment executed by the alignment apparatus ALG is outputted to each exposure apparatus EX via a network NET that connects the alignment apparatus ALG and each exposure apparatus EX.

The shuttle SHL that holds the wafer W to which the alignment is already executed is transported to each exposure apparatus EX via the transport line LN. In order to transport the shuttle SHL, the transport line LN is provided with a guide member LNa, a shuttle carrier LNb and a shuttle carrier LNc. The guide member LNa is an elongate member that is disposed between the exposure apparatuses EX1 to EX5 and the exposure apparatuses EX6 to EX10 and that extends along the arrangement direction (the Y axis direction in the example illustrated in FIG. 1) of the exposure apparatuses EX1 to EX5 (alternatively, the exposure apparatuses EX6 to EX10). Each of the shuttle carriers LNb and LNc is movable along the guide member LNa. Each of the shuttle carriers LNb and LNc is provided with a not-illustrated housing shelf for housing the plurality of shuttles SHL. For example, each of the shuttle carriers LNb and LNc is provided with the not-illustrated housing shelf for housing the shuttles SHL the number of which is same as the number (5 in the example illustrated in FIG. 1) of the exposure apparatuses EX arranged in line. The shuttle carriers LNb is configured to deliver and receive the shuttle SHL that holds the wafer W from and to each of the exposure apparatuses EX1 to EX5 while moving along the guide member LNa. The shuttle carriers LNc is configured to deliver and receive the shuttle SHL that holds the wafer W from and to each of the exposure apparatuses EX6 to EX10 while moving along the guide member LNa.

Next, one example of an operation of transporting the shuttle SHL to each exposure apparatus EX via the transport line LN will be described. Firstly, the shuttle carrier LNb that does not yet house the shuttle SHL moves to the inside of the alignment apparatus ALG by moving along the guide member LNa one portion of which is disposed in the alignment apparatus ALG. Then, five shuttles SHL each of which holds the wafer W to which the alignment is already executed are housed in the shuttle carrier LNb by the not-illustrated transport arm of the alignment apparatus ALG. Then, the shuttle carrier LNb moves to a position that faces the load chamber Cb1 of the exposure apparatus EX1. Then, one of the five shuttles SHL housed in the shuttle carrier LNb is carried into the load chamber Cb1 through a shutter Cco (see FIG. 2) formed at an outer surface of the load chamber Cb1 by a not-illustrated transport arm disposed in the load chamber Cb1. The space in the load chamber Cb1 is the atmospheric pressure space during a period when the shuttle SHL is carried into the load chamber Cb1. Then, same operation is executed in order between the shuttle carrier LNb and the load chambers Cb2 to Cb5 with the movement of the shuttle carrier LNb along the guide member LNa. Moreover, same operation is executed in order between the shuttle carrier LNc and the load chambers Cb6 to Cb10.

Then, the inner space in the load chamber Cb1 is evacuated so that the space in the load chamber Cb1 becomes the vacuum space. Then, the shuttle SHL in the load chamber Cb1 is carried into the exposure chamber Ca1 through a not-illustrated shutter formed at a border between the load chamber Cb1 and the exposure chamber Ca1 by the not-illustrated transport arm disposed in at least one of the load chamber Cb1 and the exposure chamber Ca1. Same operation is executed between the load chambers Cb2 to Cb10 and the exposure chambers Ca2 to Ca10, respectively. As a result, the wafer W held by the shuttle SHL is exposed in each of the exposure chambers Ca1 to Ca10.

When the exposure of the wafer W in the exposure chamber Ca1 is completed, the shuttle SHL in the exposure chamber Ca1 is carried into the unload chamber Cc1 through a not-illustrated shutter formed at a border between the unload chamber Cc1 and the exposure chamber Ca1 by the not-illustrated transport arm disposed in at least one of the unload chamber Cc1 and the exposure chamber Ca1. The space in the unload chamber Cc1 is the vacuum space during a period when the shuttle SHL is carried into the unload chamber Cc1. Same operation is executed between the unload chambers Cc2 to Cc10 and the exposure chambers Ca2 to Ca10, respectively.

Then, the shuttles SHL in the unload chambers Cc1 to Cc5 are carried out to the shuttle carrier LNb. Here, the shuttle carrier LNb carries the shuttles SHL into the load chambers Cb1 to Cb5 in order. Therefore, the shuttle carrier LNb houses no shuttle SHL when the shuttle carrier LNb finishes carrying the shuttle SHL into the load chamber Cb5. Thus, carrying out the shuttle SHL to the shuttle carrier LNb is executed from the unload chamber Cc5 to the unload chamber Cc1 in order, in order to reduce an unnecessary movement of the shuttle carrier LNb. Specifically, the space in the unload chamber Cc5 turns into the atmospheric space after the shuttle SHL is carried into the unload chamber Cc5. Then, the shuttle SHL in the unload chamber Cc5 is carried out to the shuttle carrier LNb through a shutter Cco (see FIG. 2) formed at an outer surface of the unload chamber Cc5 by a not-illustrated transport arm disposed in the unload chamber Cc5. Same operation is executed in order between the shuttle carrier LNb and the unload chambers Cc4 to Cc1. Moreover, carrying out the shuttle SHL to the shuttle carrier LNc is executed from the unload chamber Cb10 to the unload chamber Cb6 in order.

Then, each of the shuttle carriers LNb and LNc that holds the shuttles SHL holding the exposed wafers W moves to the inside of the alignment apparatus ALG. Then, the shuttles SHL housed in each of the shuttle carriers LNb and LNc are carried out from each of the shuttle carriers LNb and LNc by the not-illustrated transport arm of the alignment apparatus ALG. Then, the wafer W is detached from the shuttle SHL by the not-illustrated transport arm of the alignment apparatus ALG. Then, the detached wafer W is carried out to the coater/developer via the transport truck TR.

(1-2) Structure of Exposure Apparatus EX

Figure 2:
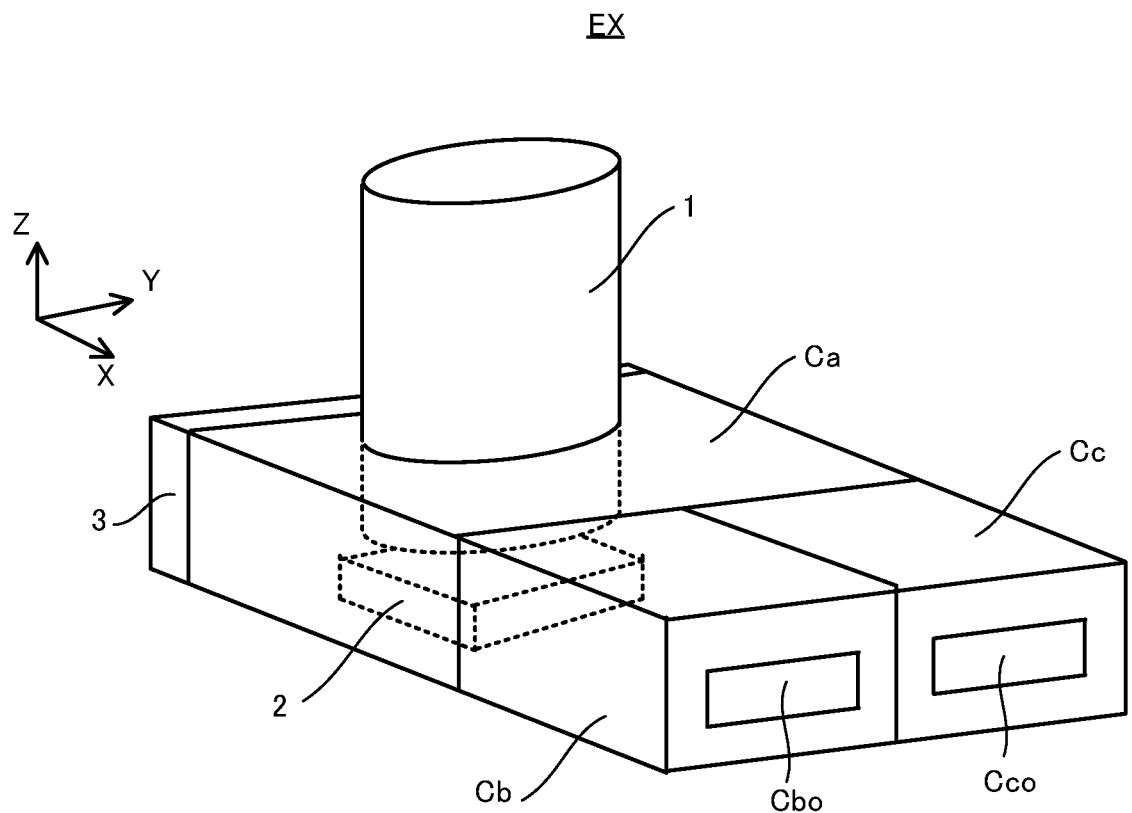
FIG. 2 is a perspective view that illustrates an exterior of an exposure apparatus of the exposure system.
Figure 3:
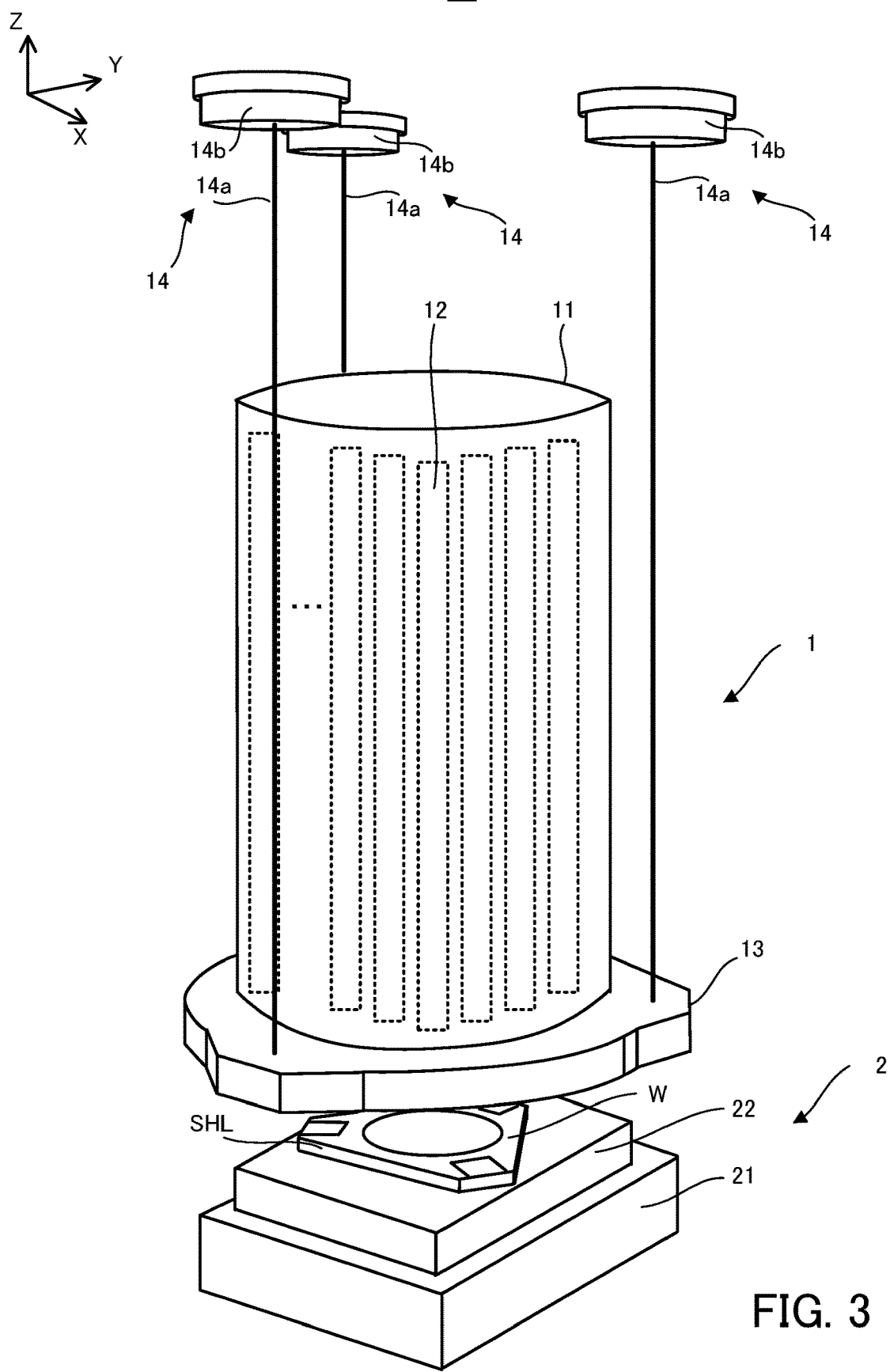
FIG. 3 is a perspective view that illustrates an exterior of an electron beam irradiation apparatus and a stage apparatus of the exposure apparatus.
Figure 4:
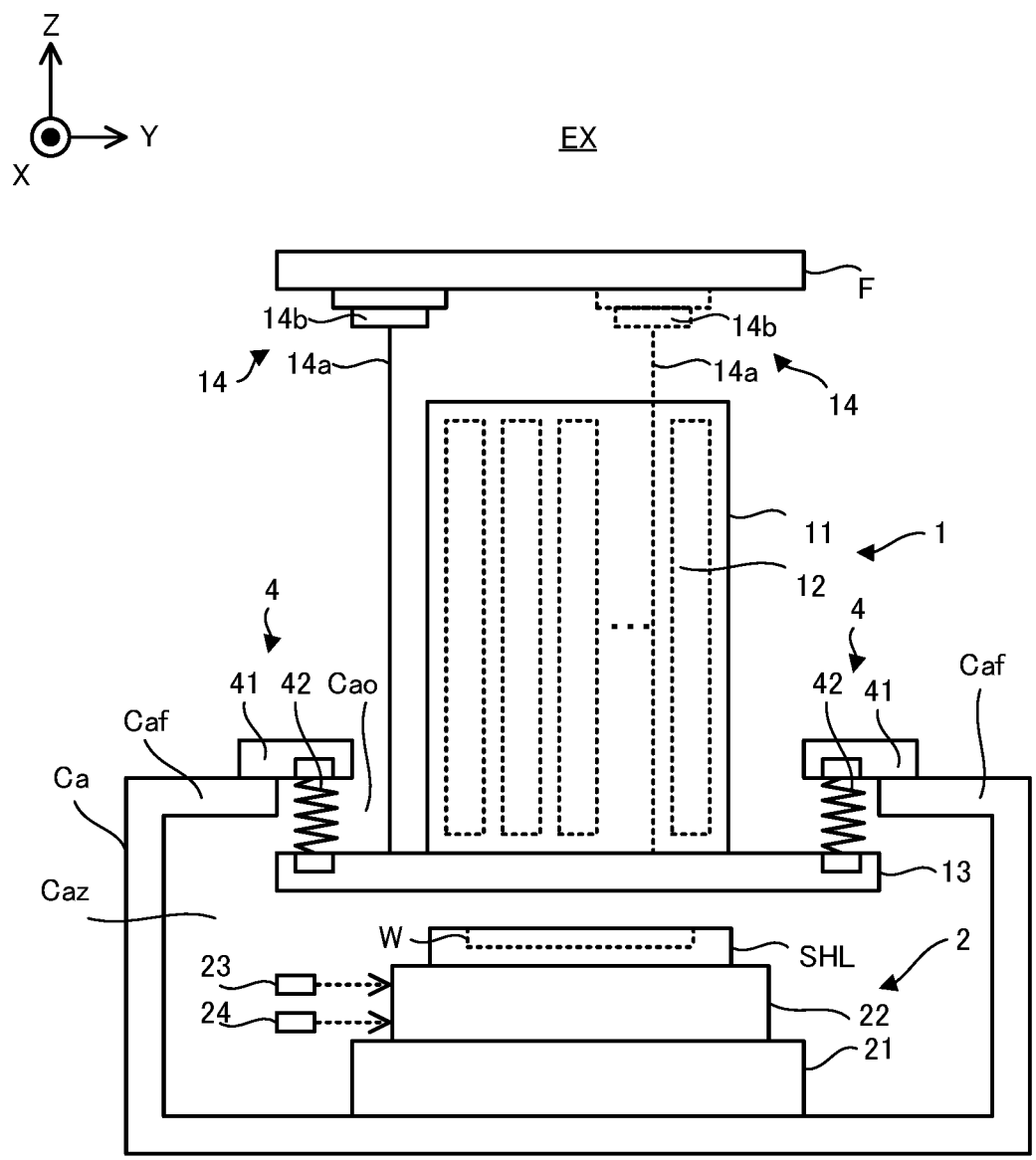
FIG. 4 is a cross-sectional view that illustrates a cross-sectional surface of the electron beam irradiation apparatus and the stage apparatus of the exposure apparatus.
Figure 5:
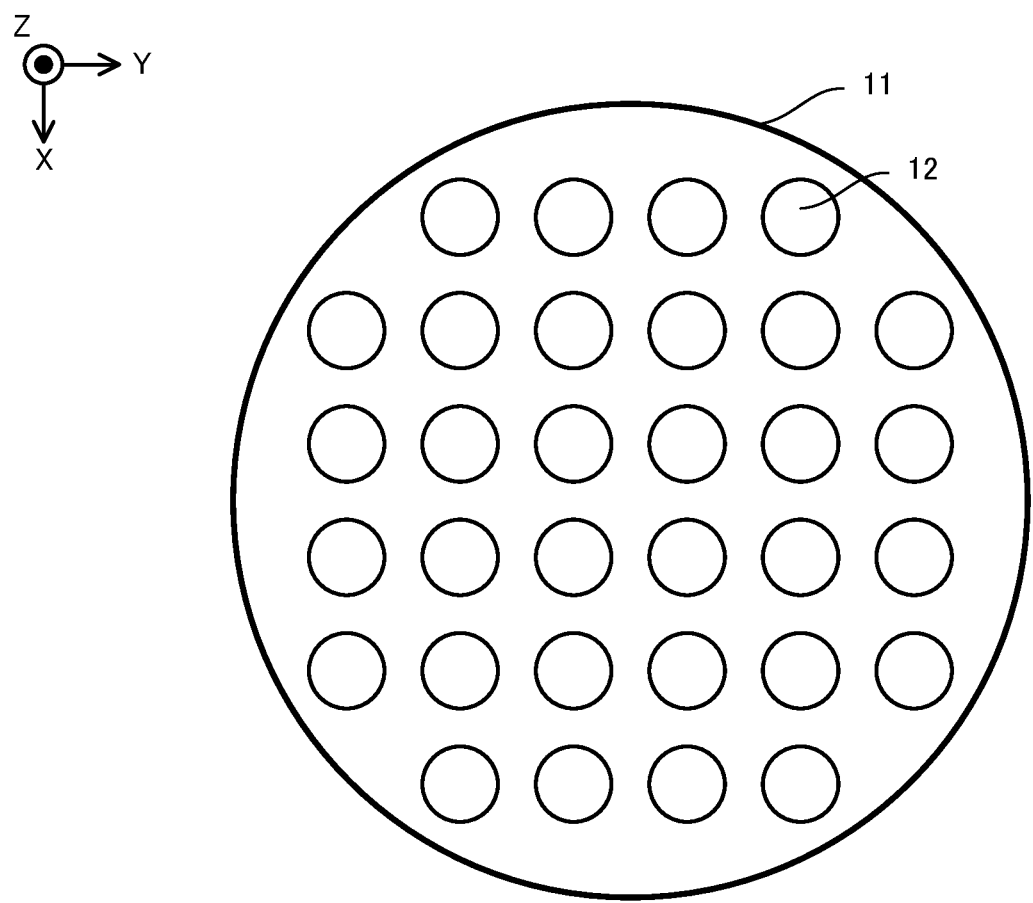
FIG. 5 is a planar view that illustrates one example of an arrangement of a plurality of electron beam optical systems (optical system columns) in a barrel of the electron beam irradiation apparatus.

Next, with reference to FIG. 2 to FIG. 5, a structure of the exposure apparatus EX will be described more in detail. FIG. 2 is a perspective view that illustrates an exterior of the exposure apparatus EX. FIG. 3 is a perspective view that illustrates an exterior of an electron beam irradiation apparatus 1 and a stage apparatus 2 of the exposure apparatus EX. FIG. 4 is a cross-sectional view that illustrates a cross-sectional surface of the electron beam irradiation apparatus 1 and the stage apparatus 2 of the exposure apparatus EX. FIG. 5 is a planar view that illustrates one example of an arrangement of a plurality of electron beam optical systems (namely, optical system columns) 12 in a barrel 11 of the electron beam irradiation apparatus 1.

As illustrated in FIG. 2 to FIG. 4, the exposure apparatus EX is provided with the electron beam irradiation apparatus 1, the stage apparatus 2 and a control apparatus 3 (note that the control apparatus 3 is not illustrated in FIG. 3 and FIG. 4). The electron beam irradiation apparatus 1 is configured to irradiate the wafer W held by the stage apparatus 2 with the electron beam EB. The stage apparatus 2 is movable while holding the wafer W. The control apparatus 3 controls the operation of the exposure apparatus EX.

One portion of the electron beam irradiation apparatus 1 is disposed in the exposure chamber Ca. In an example illustrated in FIG. 2 and FIG. 4, a lower end part of the below described barrel 11 of the electron beam irradiation apparatus 1 (namely, one portion of the electron beam irradiation apparatus 1 that is located at the stage apparatus 2 side) is disposed in the exposure chamber Ca. Moreover, whole of the stage apparatus 2 is disposed in the exposure chamber Ca. However, whole of the electron beam irradiation apparatus 1 may be disposed in the exposure chamber Ca.

The electron beam irradiation apparatus 1 is provided with the cylindrical barrel 11. An inner space in the barrel 11 becomes the vacuum space during a period when the electron beam EB is irradiated. Specifically, the inner space in the barrel 11 is connected to a chamber space Caz in the exposure chamber Ca via a lower open end of the barrel 11 (namely, an opening through which the electron beam EB is allowed to pass). Thus, the inner space in the barrel 11 becomes the vacuum space by the evacuation of the chamber space Caz.

Moreover, the electron beam irradiation apparatus 1 is provided with a metrology frame 13 for supporting the barrel 11 from below. The metrology frame 13 includes an annular plate member on which three projecting parts are formed at an outer periphery part with the central angle at an interval of 120 degrees as illustrated in FIG. 3. An lowest end part of the barrel 11 is a small diameter part having a diameter that is smaller than that of an upper part that is above the lowest end part of the barrel 11. A border part between the lowest end part of the barrel 11 and the upper part of the barrel 11 is a step part. The lowest end part is inserted into a circular opening of the metrology frame 13. Moreover, a bottom surface of the step part contacts with an upper surface of the metrology frame 13. As a result, the barrel 11 is supported by the metrology frame 13 from below.

Moreover, the electron beam irradiation apparatus 1 is provided with three suspension support mechanisms 14 for supporting the metrology frame 13. The metrology frame 13 is suspended and supported from an outer frame F (see FIG. 4) via the three suspension support mechanisms 14 a lower ends of which are connected to the above described three projection parts. Each suspension support mechanism 14 is provided with a wire 14a one end of which is connected to the metrology frame 13 and a passive vibration isolation pad 14b that connects the other end of the wire 14a and the outer frame F. The vibration isolation pad 14b includes at least one of an air dumper and a coil spring, for example. Thus, the vibration isolation pad 14b prevents a vibration of the outer frame F from being transmitted to the metrology frame 13 (furthermore, the barrel 11).

As described above, one portion of the electron beam irradiation apparatus 1 is disposed in the exposure chamber Ca. The metrology frame 13 corresponds to one portion of the electron beam irradiation apparatus 1 that is disposed in the exposure chamber Ca. Moreover, one portion of the barrel 11 (specifically, the lower end part) also corresponds to one portion of the electron beam irradiation apparatus 1 that is disposed in the exposure chamber Ca. In order to dispose one portion of the barrel 11 and the metrology frame 13 in the exposure chamber Ca, an opening Cao is formed at an upper surface of the exposure chamber Ca as illustrated in FIG. 4. Namely, the exposure chamber Ca includes, as one portion of a partition wall of the exposure chamber Ca, a circular-shaped (alternatively, a frame-like-shaped) flange part Caf for defining the opening Cao. One portion of the barrel 11 and the metrology frame 13 are inserted into the exposure chamber Ca via the opening Cao. Moreover, the flange part Caf and metrology frame 13 are connected (in other words, coupled) via a circular-shaped (alternatively, a frame-like-shaped) connecting part 4. The connecting part 4 is provided with a circular-shaped (alternatively, a frame-like-shaped) plate 41 that is disposed on an upper surface of the flange part Caf and a circular-shaped (alternatively, a frame-like-shaped) bellows 42 that connects the plate 41 and the metrology frame 13 to surround the barrel 11. An outer periphery part of a lower surface of the plate 41 is connected to the upper surface of the flange part Caf throughout the outer periphery. An upper part of the bellows 42 is connected to an inner periphery part of the lower surface of the plate 41 throughout the outer periphery. A lower part of the bellows 42 is connected to the upper surface of the metrology frame 13 throughout the outer periphery. Thus, an airtightness of a space surrounded by the exposure chamber Ca, the plate 41, the bellows 42, the metrology frame 13 and the barrel 11 is ensured. Namely, the exposure chamber Ca, the plate 41, the bellows 42, the metrology frame 13 and the barrel 11 forms the vacuum space in which the stage apparatus 2 (especially, the wafer W held by the stage apparatus 2) is housed. Moreover, the bellows 42 prevents a vibration (especially, a vibration in the Z axis direction) of exposure chamber Ca from being transmitted to the metrology frame 13 (furthermore, the barrel 11).

The electron beam irradiation apparatus 1 is further provided with, in the barrel 11, the plurality of electron beam optical systems (in other words, optical system columns) 12 that are arranged to have a predetermined positional relationship in an XY plane. Namely, the exposure apparatus EX is what we call a multi-column type of exposure apparatus. For example, as illustrated in FIG. 5, the plurality of electron beam optical systems 12 are arranged in a matrix in the XY plane. Alternatively, the plurality of electron beam optical systems 12 may be arranged in an array (namely, in line) in the XY plane. The below described description uses an example in which the electron beam irradiation apparatus 1 is provided with N (note that N is an integer number equal to or larger than 2) electron beam optical systems 12. N may be dozens to one hundred and dozens (for example, 88 to 100), however, N may be another number. Each electron beam optical system 12 is configured to irradiate the electron beam EB independently.

The stage apparatus 2 is disposed below (namely, at a −Z side from) the electron beam irradiation apparatus 1. The stage apparatus 2 is provided with a surface plate 21 and a stage 22. The surface plate 21 is disposed on a bottom surface of the exposure chamber Ca. The stage 22 is disposed on the surface plate 21. A not-illustrated vibration isolation apparatus for preventing a vibration of the surface plate 21 from being transmitted to the stage 22 is disposed between the surface plate 21 and the stage 22. The stage 22 is configured to hold the shuttle SHL holding the wafer W. Therefore, the wafer W is exposed by the electron beam EB irradiated by the electron beam irradiation apparatus 1 in a state where the wafer W is held by the shuttle SHL.

The stage 22 is movable along at least one of the X axis direction, the Y axis direction, the Z axis direction, the θX direction, the θY direction and the θZ direction while holding the shuttle SHL, under the control of the control apparatus 3. In order to move the stage 22, the stage apparatus 2 is provided with a stage driving system 23 (see FIG. 4). The stage driving system 23 moves the stage 22 by using any motor (for example, a linear motor), for example. Moreover, the stage apparatus 2 is provided with a position measuring equipment 24 for measuring a position of the stage 22. The position measuring equipment 24 includes at least one of an encoder and a laser interferometer, for example. Note that the stage driving system 23 and the position measuring equipment 24 are not illustrated in FIG. 2 and FIG. 3 and are illustrated only in FIG. 4 for the purpose of simplifying the drawings. Although FIG. 4 illustrates the cross-sectional surface of the exposure apparatus EX, FIG. 4 may not illustrate the cross-sectional surface of the stage driving system 23 and the position measuring equipment 24.

(1-3) Structure of Electron Beam Optical System 12

Figure 6:
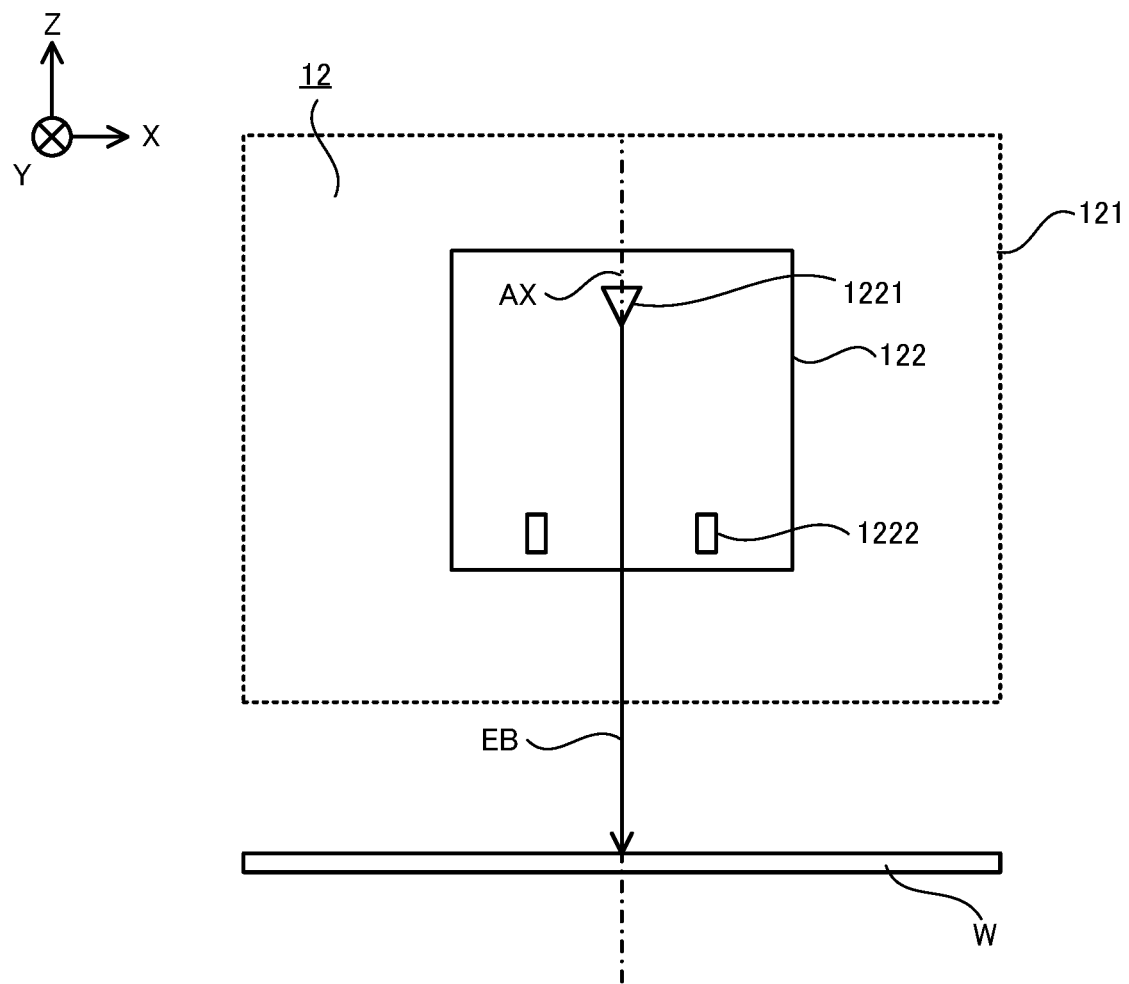
FIG. 6 is a cross-sectional view that illustrates a cross-sectional surface (a cross-sectional surface including an optical axis of the electron beam optical system) of the electron beam optical system.

Next, with reference to FIG. 6, a structure of the electron beam optical system 12 will be described. FIG. 6 is a cross-sectional view that illustrates a cross-sectional surface (a cross-sectional surface including the optical axis AX of the electron beam optical system 12) of the electron beam optical system 12.

As illustrated in FIG. 6, the electron beam optical system 12 is provided with a cylindrical housing (in other words, a column cell) 121 that is configured to shield against the electromagnetic field. Moreover, the electron beam optical system 12 is provided with an electron gun 122 and a beam optical apparatus 122 in the housing 121.

The beam optical apparatus 122 includes an electron gun 1221 that is configured to emit an electron beam EB. The electron gun 1221 emits the electron beam EB having a predetermined acceleration voltage (for example, 50 keV).

The beam optical apparatus 122 includes a deflector 1222. The deflector 1222 is an electromagnetic deflector that is provided with at least one pair of first coils 1222X (not illustrated in FIG. 6 for the purpose of simplifying the illustration) that are disposed to sandwich the optical axis AX along the Y axis direction and at least one pair of second coils 1222Y (not illustrated in FIG. 6 for the purpose of simplifying the illustration) that are disposed to sandwich the optical axis AX along the X axis direction. A driving electrical current that is controllable under the control of the control apparatus 3 is supplied to the pair of the first coils 1222X. As a result, the deflector 1222 allows the electron beam EB to be deflected in the X axis direction by using a magnetic field generated by the pair of the first coils 1222X. As a result, the deflector 1222 is configured to control an irradiation position of the electron beam EB (for example, the irradiation position on the wafer W and a position of a below descried irradiation area EA) in the X axis direction. Moreover, a driving electrical current that is controllable under the control of the control apparatus 3 is supplied to the pair of the second coils 1222Y. As a result, the deflector 1222 allows the electron beam EB to be deflected in the Y axis direction by using a magnetic field generated by the pair of the second coils 1222Y. As a result, the deflector 1222 is configured to control the irradiation position of the electron beam EB in the Y axis direction.

Note that the deflector 1222 may be an electrostatic deflector that is provided with a pair of first electrode plates that are disposed to sandwich the optical axis AX along the X axis direction and a pair of second electrode plates that are disposed to sandwich the optical axis AX along the Y axis direction, instead of the pair of the first coils 1222X and the pair of the second coils 1222Y. In this case, an electrical voltage that is controllable under the control of the control apparatus 3 is applied to each of the pair of the first electrode plates and the pair of the second electrode plates. As a result, the deflector 1222 is configured to control the irradiation position of the electron beam EB in the X axis direction by using an electric field generated between the pair of the first electrode plates and to control the irradiation position of the electron beam EB in the Y axis direction by using an electric field generated between the pair of the second electrode plates.

In addition, the beam optical apparatus 122 may include a shaping apparatus (for example, a shaping diaphragm that is a plate on which an aperture having any shape is formed, an electromagnetic lens and the like) that is configured to shape the electron beam EB, for example. The beam optical apparatus 122 may include an objective lens (for example, an electromagnetic lens and the like) that is configured to allow the electron beam EB to form an image on the surface of the wafer W with a predetermined reduction magnification, for example. The beam optical apparatus 122 may include an adjuster (for example, an electromagnetic lens and the like) that is configured to control at least one of a rotation (namely, a position in the θZ direction) of an image that is formed by the electron beam EB on a predetermined optical plane (for example, an optical plane that intersects with an optical path of the electron beam EB), a magnification of the image and a focal position that corresponds to an image-formed position, for example. The beam optical apparatus 122 may include a detect apparatus (for example, a semiconductor type of reflected electron detect apparatuses using a semiconductor having a p-n junction or a pin junction) that is configured to detect the alignment mark and the like formed on the wafer W in order to execute the alignment of the wafer W, for example.

Figure 7:
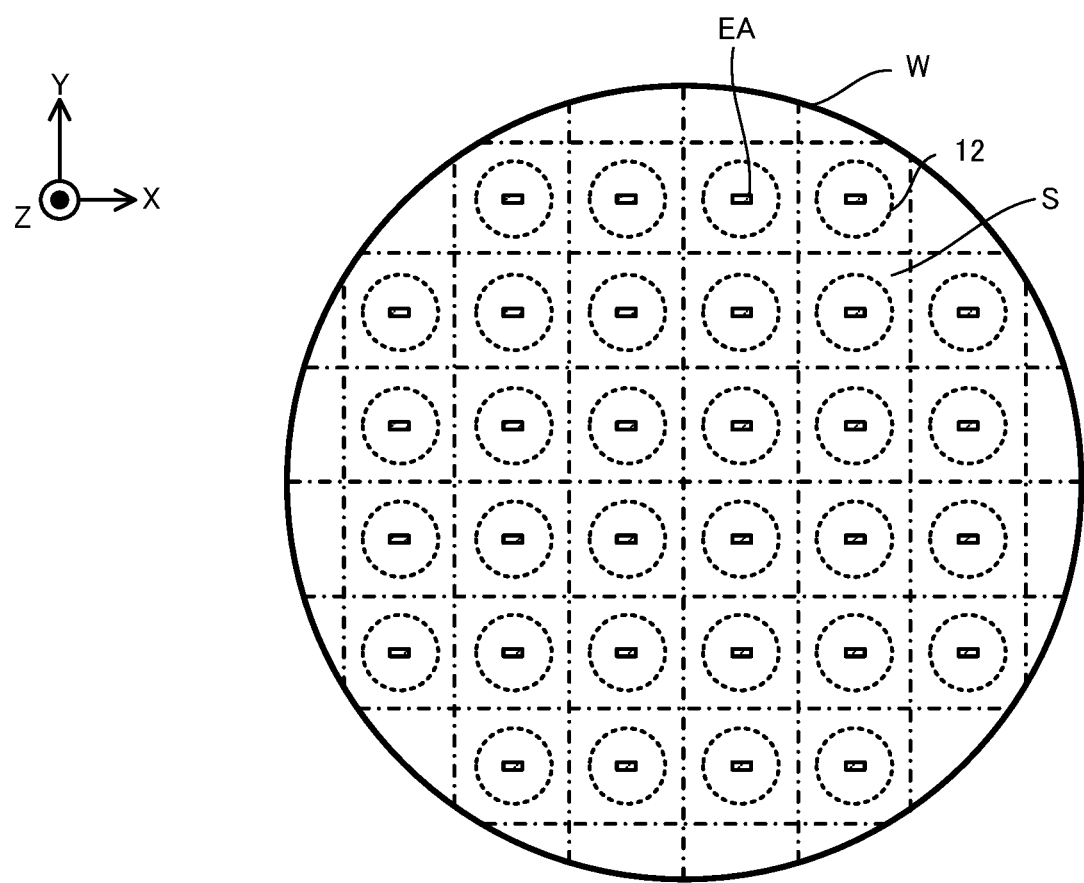
FIG. 7 is a planar view that illustrates irradiation positions (irradiation areas) of the electron beams from the plurality of electron beam optical systems on a wafer.

The above described irradiation of the electron beam EB is executed by the plurality of electron beam optical systems 12 in parallel. Here, the plurality of electron beam optical systems 12 correspond to the plurality of shot areas S on the wafer W one-on-one. However, the number of the electron beam optical systems 12 may be larger than the number of the shot areas S. Each electron beam optical system 12 is allowed to irradiate the above described electron beam EB in the quadrangular (for example, 100 micrometer×20 micrometer) irradiation area EA. Thus, as illustrated in FIG. 7, the plurality of electron beam optical systems 12 are allowed to irradiate the plurality of electron beams EB to the plurality of irradiation areas EA set on the plurality of shot areas S on the wafer W, respectively, at a time. When the plurality of electron beam optical systems 12 irradiate the electron beams EB while moving the wafer W relatively with respect to these irradiation areas EA, the plurality of shot areas S on the wafer W are exposed in parallel. As a result, a pattern that is smaller than a resolution limit of an exposure apparatus in a comparison example for exposing the wafer by an ultraviolet light is formed with a relatively high throughput.

(2) Exposure Operation Executed by Exposure Apparatus EX

Next, an exposure operation for exposing the wafer W by the exposure apparatus EX will be described. In the present embodiment, the exposure apparatus EX is configured to expose the wafer W by a plurality of electron beams EB irradiated by the plurality of electron beam optical systems 12, respectively. In this case, the plurality of electron beam optical systems 12 irradiates the plurality of electron beams EB at a time (in other word, in parallel), respectively. Thus, there is a possibility that the electron beam B irradiated by one electron beam system 12 of the plurality of electron beam systems 12 is influenced by the electron beam B irradiated by another electron beam system 12 of the plurality of electron beam systems 12. In the following description, with reference to FIG. 8 to FIG. 10, the influence from the electron beam B irradiated by another electron beam system 12 to the electron beam B irradiated by one electron beam system 12 will be described specifically.

Figure 8:
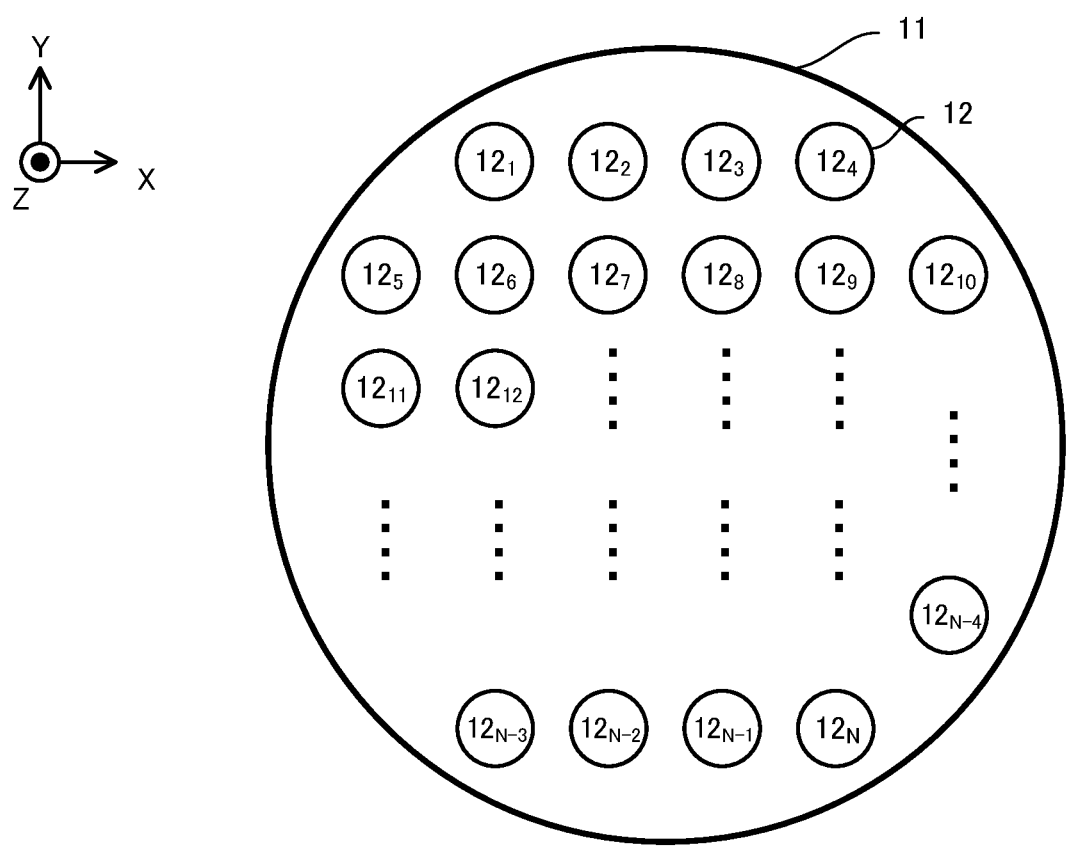
FIG. 8 is a planar view that illustrates N electron beam optical systems.
Figure 9:
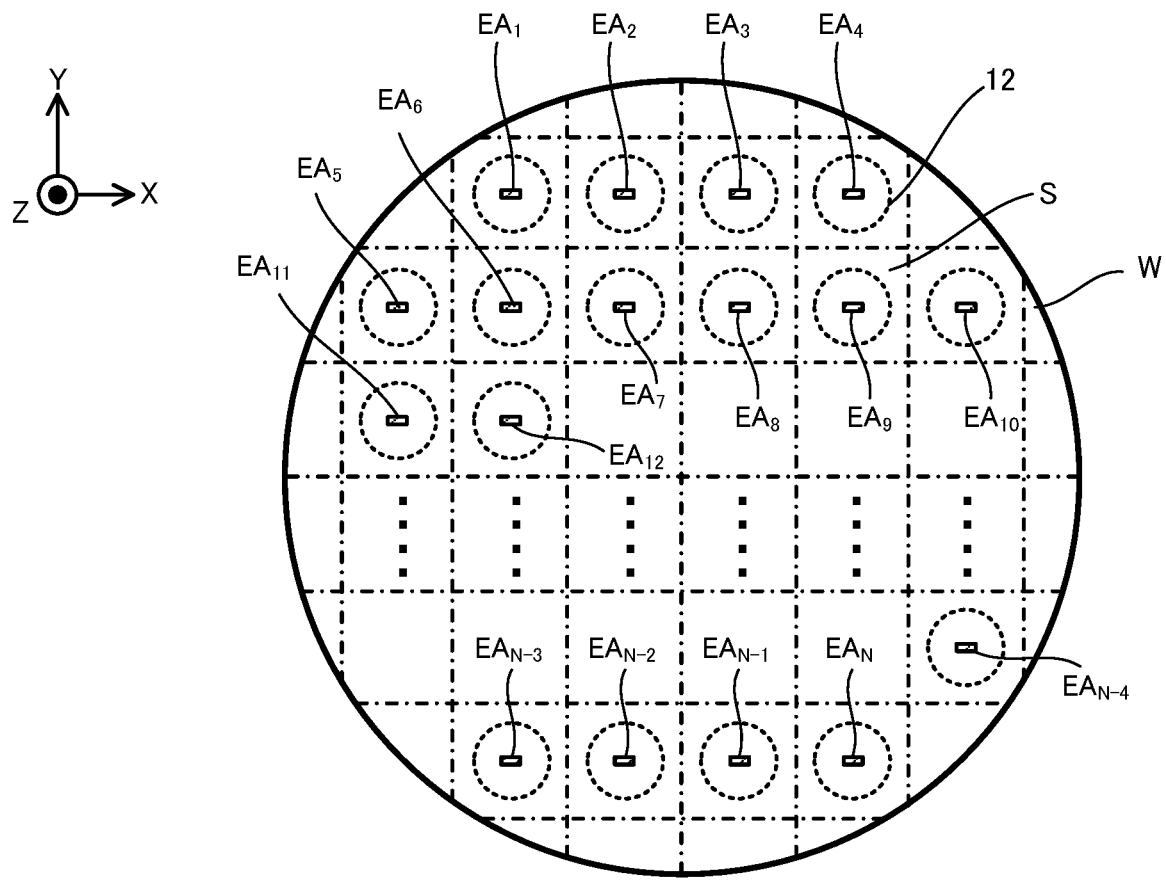
FIG. 9 is a planar view that illustrates N irradiation areas to which the N electron beam optical systems irradiate N electron beams, respectively.
Figure 10:
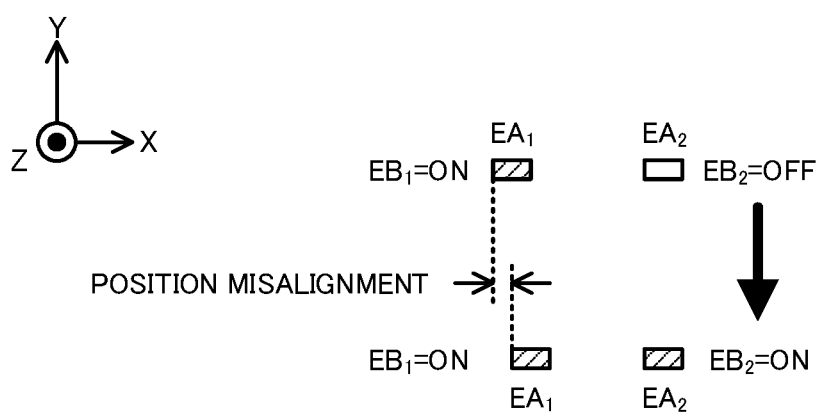
FIG. 10 is a planar view that illustrates a position misalignment of the irradiation area.

Firstly, as illustrated in FIG. 8, the N electron beam optical systems 12 are distinguished from one another by referring to them as the electron beam optical system $12_1$, the electron beam optical system $12_2$, the electron beam optical system $12_3$, . . . , the electron beam optical system $12_{N-1}$ and the electron beam optical system $12_N$, respectively, for the purpose of simple description. Moreover, the N electron beams EB irradiated by the N electron beam optical systems 12, respectively, are distinguished from one another by referring to them as the electron beam $EB_1$, the electron beam $EB_2$, the electron beam $EB_3$, . . . , the electron beam $EB_{N-1}$ and the electron beam $EB_N$, respectively. Moreover, as illustrated in FIG. 9, the irradiation areas EA on the wafer W to which the N electron beam optical systems 12 irradiate the N electron beams EB, respectively, are distinguished from one another by referring to them as the irradiation areas $EA_1$, the irradiation areas $EA_2$, the irradiation areas $EA_3$, . . . , the irradiation areas $EA_{N-1}$ and the irradiation areas $EA_N$, respectively, Here, the influence from the electron beams EB irradiated by the electron beam optical systems 12 other than the electron beam optical system $12_1$ to the electron beam $EB_1$ irradiated by the electron beam optical system $12_1$ will be considered. Firstly, when the electron beam optical systems $12_1$ and $12_2$ irradiate the electron beams $EB_1$ and $EB_2$, respectively, a coulomb force (namely, a coulomb interaction) acts between the electron beams $EB_1$ and $EB_2$. Namely, the electron beam $EB_1$ is influenced by an electric field generated due to the electron beam $EB_2$ around the electron beam optical system $12_2$. On the other hand, when the electron beam optical system $12_1$ irradiates the electron beam $EB_1$ and the electron beam optical system $12_2$ does not irradiate the electron beam $EB_2$, the coulomb force from the electron beam $EB_2$ does not act on the electron beam $EB_1$. Thus, as illustrated in FIG. 10, a position of the irradiation area $EA_1$ (a lower side in FIG. 10) of the electron beam $EB_1$ when the electron beam $EB_2$ is irradiated is misaligned (displaced) along an XY plane (namely, along a surface of the wafer W on which the irradiation area $EA_1$ is set) with respect to a position of the irradiation area $EA_1$ (an upper side in FIG. 10) of the electron beam $EB_1$ when the electron beam $EB_2$ is not irradiated. An amount of the position misalignment (the position displacement) varies depending on an electrical current amount of the electron beam $EB_2$ and a position of the irradiation area $EA_2$. This is because the coulomb force acting between two charges is proportional to a charge amount of each of two charges and is inversely proportional to a square of a distance between two charges.

Moreover, the position misalignment of the irradiation area $EA_1$ arises due to the coulomb force acting between the electron beam $EB_1$ and each of the electron beam $EB_3$ to the electron beam $EB_N$. Moreover, the position misalignment of the irradiation area $EA_2$ also arises due to the coulomb force acting between the electron beam $EB_2$ and each of the electron beam $EB_1$ and electron beam $EB_3$ to the electron beam $EB_N$. Moreover, the position misalignment of each of the irradiation area $EA_3$ to the irradiation area $EA_N$ also arises due to the same reason.

Namely, the position of the irradiation area EA, to which a certain electron beam optical system $12_i$ (note that i is an integer number from 1 to N) irradiates the electron beam $EB_1$ varies due to the N−1 electron beams $EB_j$ irradiated by the N−1 electron beam optical systems $12_j$ (note that j is an integer number from 1 to N and is different from i) other than the electron beam optical system $12_i$, respectively. Thus, if the irradiation area $EA_i$ the position of which is misaligned (namely, the position of which varies) is set on a position on the wafer W that is different from a proper position on which the irradiation area $EA_i$ should be set, the electron beam $EB_i$ is irradiated to an undesired irradiation position on the wafer W. This has a possibility to result in a deterioration of an exposure quality of the exposure apparatus EX.

Thus, in the present embodiment, the control apparatus 3 controls one electron beam optical system 12 on the basis of the influence from the electron beams EB irradiated by another electron beam optical system 12 to the electron beam EB irradiated by one electron beam optical system 12 so that one electron beam optical system 12 irradiates the electron beam properly. Namely, the control apparatus 3 controls one electron beam optical system $12_i$ so that one electron beam optical system $12_i$ irradiates the electron beam $EB_i$ to the irradiation area $EA_i$ that is set at a desired position (namely, the irradiation area $EA_i$ is set at the desired position) by considering the fact that the position of the irradiation area $EA_i$ of the electron beam $EB_i$ irradiated by one electron beam optical system $12_i$ varies (namely, is changed) depending on the electron beam $EB_j$ irradiated by another electron beam optical system $12_j$.

However, as described above, in order to precisely calculating the amount of the position misalignment of the irradiation area $EA_i$, the control apparatus 3 needs to precisely calculate an interaction between the electron beam $EB_i$ and the N−1 electron beams $EB_j$. Moreover, in order to precisely calculating the amounts of the position misalignments of all of the irradiation area $EA_1$ to the irradiation area $EA_N$, the control apparatus 3 needs to repeat the calculation of the interaction between the electron beam $EB_i$ and the N−1 electron beams $EB_j$ by N times. Therefore, there is a possibility that a calculation cost to sequentially calculate the position misalignments of all of the irradiation area $EA_1$ to the irradiation area $EA_N$ becomes huge. Namely, there is a possibility that it is difficult for the control apparatus 3 to sequentially calculate the position misalignments of all of the irradiation area $EA_1$ to the irradiation area $EA_N$ at a processing speed that does not arise the delay to the exposure of the wafer W in parallel with the exposure of the wafer W.

Thus, in the present embodiment, the control apparatus 3 generates a position misalignment information I relating to the position misalignment of each of the irradiation area $EA_1$ to the irradiation area $EA_N$ in advance before the wafer W is exposed. In this case, the control apparatus 3 calculates the position misalignment of each of the irradiation area $EA_1$ to the irradiation area $EA_N$ on the basis of the position misalignment information I generated in advance. Namely, the control apparatus 3 does not necessarily calculates the interaction among the N electron beams $EB_1$ to the electron beams $EB_N$ in order to sequentially calculate the position misalignment of each of the irradiation area $EA_1$ to the irradiation area $EA_N$ during a period when the wafer W is exposed. Then, the control apparatus 3 adjusts the position (namely, the position on the wafer W) of each of the irradiation area $EA_1$ to the irradiation area $EA_N$ by controlling the N electron beam optical systems 12 so as to cancel the calculated position misalignments.

Next, a generation operation of the position misalignment information I and the exposure operation of the wafer W will be described in order.

(2-1) Generation Operation of Position Misalignment Information I

Figure 11:
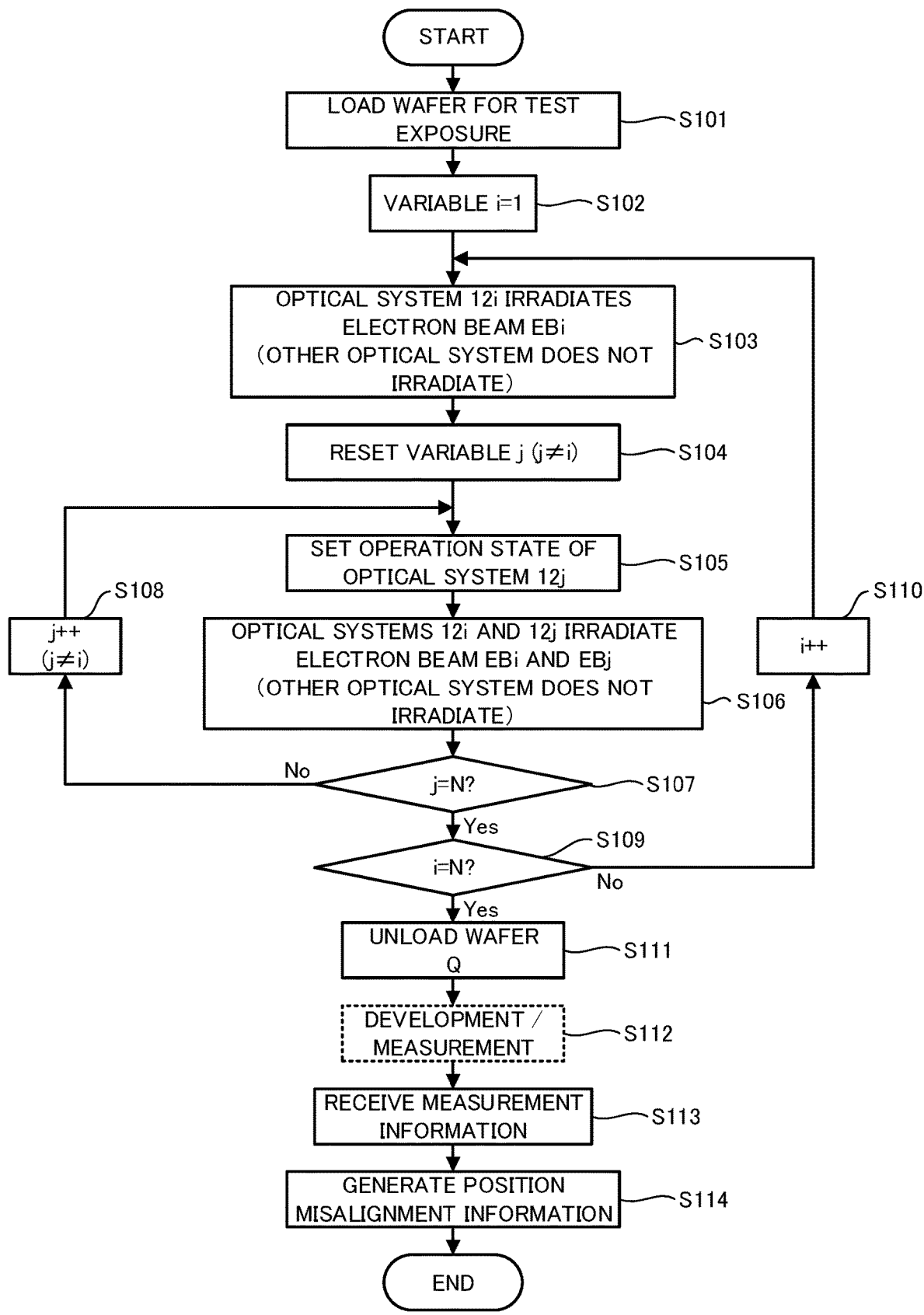
FIG. 11 is a flowchart that illustrates a flow of a generation operation of a position misalignment information.

With reference to a flowchart in FIG. 11, the generation operation of the position misalignment information I will be described. Note that an example in which the position misalignment information I is generated by the control apparatus 3 will be described in the following description.

In the present embodiment, the position misalignment information I is generated on the basis of a result of a test exposure (namely, the irradiation of the electron beams EB from the N electron beam optical systems 12) executed by the exposure apparatus EX to a wafer Wt (namely, a wafer Wt on which an electron beam resist is coated) for a test exposure. The test exposure is executed when the exposure apparatus EX is activated (namely, is booted), for example. However, the test exposure may be executed at any timing. Thus, firstly, the wafer Wt for the test exposure is loaded on the exposure apparatus EX (a step S101).

Then, the control apparatus 3 resets a variable i to 1 (a step S102). In the generation operation of the position misalignment information I, the variable i is a variable for selecting one electron beam EB (namely, the electron beam EB that is a target for a measurement of the position misalignment of the irradiation area EA) for measuring the influence from another electron beam EB. Thus, the electron beam $EB_i$ irradiated by the electron beam optical system $12_i$ is the electron beam EB that is the target for the measurement of the position misalignment of the irradiation area EA. Namely, the test exposure for generating the position misalignment information $I_i$ relating to the position misalignment of the irradiation area $EA_i$ of the electron beam $EB_i$ irradiated by the electron beam optical system $12_i$ is executed on the basis of the variable i. Note that the position misalignment information $I_i$ corresponds to one portion of the position misalignment information I.

Then, the control apparatus 3 controls the plurality of electron beam optical systems 12 so that the electron beam optical system $12_i$ irradiates the electron beam $EB_i$ and all electron beam optical systems 12 except for the electron beam optical system $12_i$ do not irradiate the electron beam EB (a step S103). As a result, the test exposure by which the electron beam optical system $12_i$ irradiates the electron beam $EB_i$ in a state where the electron beam optical systems $12_1$ to $12_N$ (note that the electron beam optical system $12_i$ is excluded) do not irradiate the electron beams $EB_1$ to $EB_N$ (note that the electron beam $EB_i$ is excluded) is executed. This test exposure is a test exposure for measuring a reference position (see the upper drawing in FIG. 10, for example) of the irradiation area $EA_i$ of the electron beam $EB_i$ irradiated by the electron beam optical system $12_i$.

Then, the control apparatus 3 resets a variable j to 1 (a step S104). In the generation operation of the position misalignment information I, the variable j is a variable for selecting the electron beam EB that influences the electron beam $EB_i$. Thus, the electron beam $EB_j$ irradiated by the electron beam optical system $12_j$ is irradiated as the electron beam EB that influences the electron beam $EB_i$. Namely, the test exposure for generating the position misalignment information $I_{ij}$ relating to the position misalignment of the irradiation area $EA_i$ due to the electron beam $EB_j$ irradiated by the electron beam optical system 12 is executed. The position misalignment information $I_{ij}$ corresponds to one portion of the position misalignment information $I_i$. Note that the variable j is different from the variable i. Thus, when the variable i is 1, the variable j is reset to not 1 but 2.

Then, the control apparatus 3 sets an operation state of the electron beam optical system $12_j$ during the test exposure (a step S105). The electron beam optical system $12_j$ irradiates the electron beam $EB_j$ in the set operation state.

The operation state includes an electrical current amount $A_j$ of the electron beam $EB_j$ irradiated by the electron beam optical system $12_j$, for example. The control apparatus 3 may set the electrical current amount $A_j$ to a predetermined electrical current amount. The control apparatus 3 may set the electrical current amount $A_j$ to a maximum electrical current amount that is allowable as the electrical current amount of the electron beam $EB_j$. In the following description, the electrical current amount $A_j$ set at the step S105 is referred to as an "electrical current amount $A_{j\_set1}$". Note that the electrical current amount $A_{j\_set1}$ is used when the position misalignment information I is generated at a below described step S114. Thus, the control apparatus 3 stores the electrical current amount $A_{j\_set1}$ in a memory and the like.

The operation state may include an irradiation position $P_j$ (namely, the position of the irradiation area $EA_j$) on the wafer W of the electron beam $EB_j$ irradiated by the electron beam optical system $12_j$, for example. The irradiation position $P_j$ may be represented by a coordinate position in a planar coordinate system set on the wafer W. The control apparatus 3 may set the irradiation position $P_j$ to a predetermined position. A position on the optical axis AX of the electron beam optical system $12_j$ (namely, an intersection of the optical axis AX and the surface of the wafer W) is one example of the predetermined position. However, the predetermined position may be any position as long as the predetermined position is included in a range to which the electron beam optical system 12 is allowed to irradiate the electron beam $EB_j$. In the following description, the irradiation position $P_j$ set at the step S105 is referred to as an "irradiation position $P_{j\_set1}$". Note that the irradiation position $P_{j\_set1}$ is used when the position misalignment information I is generated at the below described step S114. Thus, the control apparatus 3 stores the irradiation position $P_{j\_set1}$ in the memory and the like.

Then, the control apparatus 3 controls the plurality of electron beam optical systems 12 so that the electron beam optical systems $12_i$ and $12_j$ irradiate the electron beams $EB_i$ and $EB_j$, respectively, and all electron beam optical systems 12 except for the electron beam optical systems $12_i$ and $12_j$ do not irradiate the electron beam EB (a step S106). In this case, the control apparatus 3 controls the electron beam optical systems $12_j$ to irradiate the electron beam $EB_j$ in the operation state set at the step S105, as described above. As a result, the test exposure by which the electron beam optical system $12_i$ irradiates the electron beam $EB_i$ in a state where the electron beam optical system 12 irradiates the electron beam $EB_j$ is executed This test exposure is a test exposure for measuring how long the irradiation area $EA_i$ is misaligned due to the electron beam $EB_j$ with respect to the reference position of the irradiation area $EA_i$ that is measurable from a result of the test exposure at the step S103.

Note that the test exposure at the step S106 is executed in a new area (namely, an unexposed area) that is different from an area on the wafer Wt in which the test exposure at the step S103 is executed. Thus, the stage 22 moves by a predetermined step amount after the test exposure at the step S103 is executed so that the test exposure at the step S106 is executed in the unexposed area. However, the stage 22 may move sequentially (what we call scanning-move) as long as the test exposure at the step S106 is executed in the unexposed area. Alternatively, a scan movement by which the stage 22 sequentially moves and a step movement by which the stage 22 moves by the predetermined step amount in a direction that is perpendicular to the scan movement may be repeated alternately as long as the test exposure at the step S106 is executed in the unexposed area.

Then, the control apparatus 3 determines whether or not the variable j is equal to N (namely, the total number of the electron beam optical systems 12) (a step S107).

As a result of the determination at the step S107, when it is determined that the variable j is not equal to N (the step S107: No), the control apparatus 3 increments the variable j by one (a step S108). Then, the control apparatus 3 executes the processing from the step S105 to the step S106 again. As a result, the test exposure for generating the position misalignment information $I_{ij}$ relating to the position misalignment of the irradiation area $EA_i$ due to the electron beam $EB_j$ irradiated by new electron beam optical system $12_j$ is executed Namely, the test exposure for generating the position misalignment information $I_{ij}$ relating to the position misalignment of the irradiation area $EA_i$ due to the electron beam $EB_j$ is repeated by setting the electron beams $EB_1$ to $EB_N$ (note that the electron beam $EB_i$ is excluded) to the electron beam $EB_j$ in order. In other words, the test exposure by which the electron beam optical system $12_i$ irradiates the electron beam $EB_i$ in the state where the electron beam optical system $12_j$ irradiates the electron beam $EB_j$ is repeated by setting the electron beam optical systems $12_1$ to $12_N$ (note that the electron beam optical system $12_i$ is excluded) to the electron beam optical system $12_j$ in order.

Specifically, for example, when the variable j is incremented from 2 in a state where the variable i is 1, the test exposure for generating the position misalignment information $I_{12}$ relating to the position misalignment of the irradiation area $EA_1$ due to the electron beam $EB_2$, the test exposure for generating the position misalignment information $I_{13}$ relating to the position misalignment of the irradiation area $EA_1$ due to the electron beam $EB_3$, . . . , the test exposure for generating the position misalignment information $I_{1N-1}$ relating to the position misalignment of the irradiation area $EA_1$ due to the electron beam $EB_{N-1}$ and the test exposure for generating the position misalignment information $I_{1N}$ relating to the position misalignment of the irradiation area $EA_1$ due to the electron beam $EB_N$ are executed in order. In other words, the test exposure by which the electron beam optical system $12_1$ irradiates the electron beam $EB_1$ in the state where the electron beam optical system $12_2$ irradiates the electron beam $EB_2$, the test exposure by which the electron beam optical system $12_1$ irradiates the electron beam $EB_1$ in the state where the electron beam optical system $12_3$ irradiates the electron beam $EB_3$, . . . , the test exposure by which the electron beam optical system $12_1$ irradiates the electron beam $EB_1$ in the state where the electron beam optical system $12_{N-1}$ irradiates the electron beam $EB_{N-1}$ and the test exposure by which the electron beam optical system $12_1$ irradiates the electron beam $EB_1$ in the state where the electron beam optical system $12_N$ irradiates the electron beam $EB_N$ are executed in order.

Note that the stage 22 moves by the predetermined step amount every time the variable j is incremented so that new test exposure is executed in new area (namely, an unexposed area) on the wafer Wt. As a result, the test exposure by which the electron beam optical system $12_i$ irradiates the electron beam $EB_i$ in the state where new electron beam optical system $12_j$ irradiates the electron beam $EB_j$ is executed in the unexposed area on the wafer Wt. However, the stage 22 may scanning-move during at least one portion of a period when the test exposure is executed as long as the test exposure that is newly executed due to the increment of the variable j is executed in the unexposed area. Alternatively, the scan movement and the step movement may be repeated alternately during at least one portion of the period when the test exposure is executed as long as the test exposure that is newly executed due to the increment of the variable j is executed in the unexposed area.

On the other hand, as a result of the determination at the step S107, when it is determined that the variable j is same as N (the step S107: Yes), it indicates that the test exposures for generating the position misalignment information $I_i$ of the irradiation area $EA_i$ due to the N−1 electron beams EB (namely, the electron beams $EB_1$ to $EB_N$ except for the electron beam $EB_i$) are completed. In this case, the control apparatus 3 determines whether or not the variable i is equal to N (a step S109).

As a result of the determination at the step S109, when it is determined that the variable i is not equal to N (the step S109: No), the control apparatus 3 increments the variable i by one (a step S110). Then, the control apparatus 3 executes the processing from the step S103 to the step S108 again. As a result, the test exposure for generating the position misalignment information $I_i$ relating to the position misalignment of the irradiation area $EA_i$ of the electron beam $EB_i$ irradiated by new electron beam optical system $12_1$. due to each of the N−1 electron beams EB (namely, the electron beams $EB_1$ to $EB_N$ except for the electron beam $EB_1$) is executed. Namely, the test exposure for generating the position misalignment information $I_i$ relating to the position misalignment of the irradiation area $EA_i$ due to each of the electron beams $EB_1$ to $EB_N$ except for the electron beam $EB_i$ is repeated by setting the electron beam optical systems $12_1$ to $12_N$ to the electron beam optical system $12_i$ in order.

Specifically, for example, when the variable i is incremented from 1 to N, the test exposure for generating the position misalignment information $I_1$ relating to the position misalignment of the irradiation area $EA_1$ due to each of the electron beams $EB_2$ to $EB_N$, the test exposure for generating the position misalignment information $I_2$ relating to the position misalignment of the irradiation area $EA_2$ due to each of the electron beams $EB_1$ and $EB_3$ to $EB_N$, . . . , the test exposure for generating the position misalignment information $I_{N-1}$ relating to the position misalignment of the irradiation area $EA_{N-1}$ due to each of the electron beams $EB_1$ to $EB_{N-2}$ and $EB_N$ and the test exposure for generating the position misalignment information IN relating to the position misalignment of the irradiation area $EA_N$ due to each of the electron beams $EB_1$ to $EB_{N-1}$ are executed in order.

On the other hand, as a result of the determination at the step S109, when it is determined that the variable i is equal to N (the step S109: Yes), it indicates that all of the test exposures for generating the position misalignment information I (namely, the position misalignment information $I_1$ to the position misalignment information $I_N$) are completed. In this case, the wafer Wt is unloaded from the exposure apparatus EX (a step S111).

Then, the unloaded wafer Wt is transported to the coater/developer via the transport line LN, the alignment apparatus ALG and the transport track TR. Then, the wafer Wt is developed by the coater/developer (a step S112). Then, the developed wafer Wt is transported to a measurement apparatus that is configured to measure a state of the wafer Wt. The measurement apparatus measures the actual irradiation position on the wafer Wt of each of the electron beams $EB_1$ to $EB_N$.

The measurement apparatus may determine the irradiation positions of the electron beams $EB_1$ to $EB_N$ on the basis of presence or absence of the electron beam resist. Alternatively, the measurement apparatus may determine the irradiation positions of the electron beams $EB_1$ to $EB_N$ on the basis of presence or absence of the exposure of the electron beam resist. In this case, the wafer Wt is not necessarily developed.

The measurement apparatus may measure the actual irradiation position on the wafer Wt of each of the electron beams $EB_1$ to $EB_N$ by imaging the wafer W and executing an image processing on an imaged result. Alternatively, the measurement apparatus may irradiate a measurement light (alternatively, a measurement electromagnetic wave) to the wafer Wt, detect a reflected light of the measurement light and measure the actual irradiation position on the wafer Wt of each of the electron beams $EB_1$ to $EB_N$ on the basis of a detected result. Alternatively, the measurement apparatus may measure the actual irradiation position on the wafer Wt of each of the electron beams $EB_1$ to $EB_N$ by using a method that is same as the above described reflected electron detect apparatus 1286.

Note that the step S112 is not a process executed by the exposure apparatus EX (especially, the control apparatus 3). However, FIG. 11 illustrates that the step S112 is one portion of the flowchart that illustrates the operation executed by the exposure apparatus EX, for the purpose of simple illustration.

A measurement information that indicates a measured result of the measurement apparatus is transmitted to the control apparatus 3. As a result, the control apparatus 3 receives the measurement information (a step S113). Then, the control apparatus 3 generates the position misalignment information I on the basis of the received measurement information (a step S114). Here, the position misalignment information I includes N position misalignment information $I_i$. Each position misalignment information $I_i$ includes N−1 position misalignment information $I_{ij}$. Thus, the control apparatus 3 generates the position misalignment information $I_i$ by repeating an operation for generating the position misalignment information $I_{ij}$ by N−1 times by incrementing j from 1 to N (note that j≠i). Moreover, the control apparatus 3 generates the position misalignment information I by repeating an operation for generating the position misalignment information $I_i$ by N times by incrementing i by from 1 to N. Namely, the control apparatus 3 generates the position misalignment information I by repeating the operation for generating the position misalignment information $I_{ij}$ by (N−1)×N times by incrementing j from 1 to N (note that and incrementing i by from 1 to N.

Figure 12:
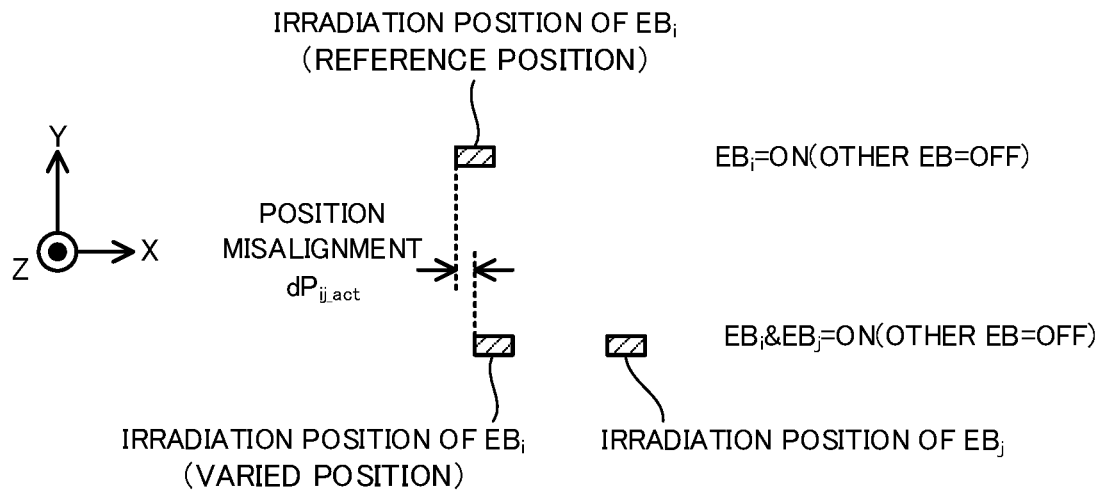
FIG. 12 is a planar view that illustrates the irradiation area to which the electron beam is actually irradiated.
Figure 13:
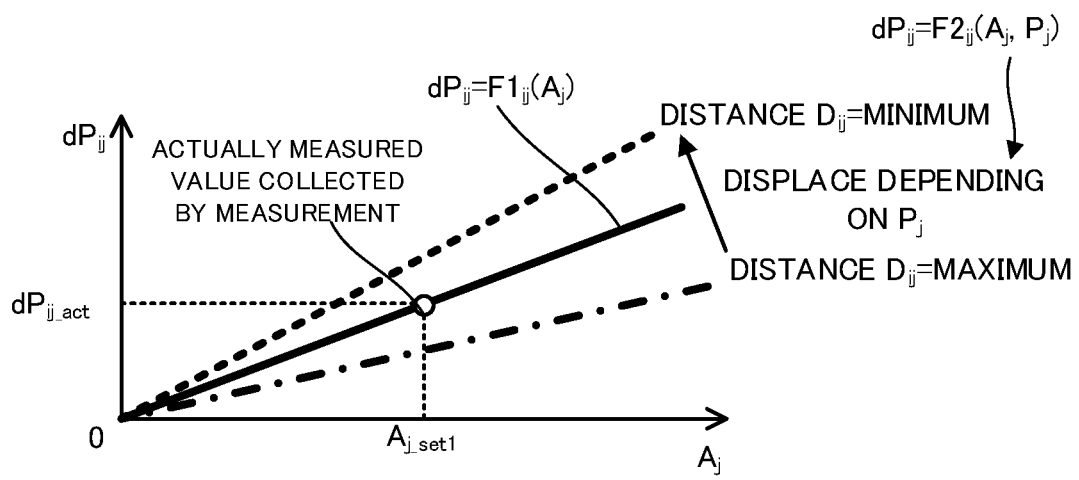
FIG. 13 is a graph that illustrates a function that is one example of the position misalignment information.

Here, with reference to FIG. 12 and FIG. 13, one example of the operation for generating the position misalignment information $I_{ij}$ will be described. The control apparatus 3 generates the position misalignment information $I_{ij}$ on the basis of the irradiation position of the electron beam $EB_i$ in a state where the electron beams $EB_1$ to $EB_N$ (note that the electron beam $EB_i$ is excluded) are not irradiated (namely, the irradiation position of the electron beam EB by the test exposure at the step S103 in FIG. 11 and the reference position) and the irradiation position of the electron beam $EB_i$ in a state where the electron beams $EB_1$ to $EB_N$ (note that the electron beams $EB_i$ and $EB_j$ are excluded) are not irradiated and the electron beam $EB_j$ is irradiated (namely, the irradiation position of the electron beam EB by the test exposure at the step S106 in FIG. 11 and it is referred to as a "varied position") as illustrated in FIG. 12. Thus, the control apparatus 3 extract an information relating to the reference position of the electron beam $EB_i$ and an information relating to the varied position of the electron beam $EB_i$ from the measurement information. Then, the control apparatus 3 calculates an actual misalignment amount $dP_{ij\_act}$ between the varied position and the reference position. Moreover, the control apparatus 3 reads the operation state (namely, the irradiation position $P_{j\_set1}$ and the electrical current amount $A_{j\_set1}$) of the electron beam optical system $12_j$ irradiating the electron beam $EB_j$ during the test exposure from the memory.

Then, the control apparatus 3 calculates a relationship between the misalignment amount $dP_{ij}$ of the irradiation position $P_i$ of the electron beam $EB_i$ (namely, a misalignment amount of the irradiation area $EA_i$) due to the electron beam $EB_j$ and the operation state of the electron beam optical system $12_j$ irradiating the electron beam $EB_j$ on the basis of the calculated misalignment amount $dP_{ij\_act}$ and the read irradiation position $P_{j\_set1}$ and electrical current amount $A_{j\_set1}$. The relationship between the misalignment amount $dP_{ij}$ and the operation state of the electron beam optical system $12_j$ corresponds to the position misalignment information $I_{ij}$. Next, one example of the position misalignment information $I_{ij}$ will be described.

As one example, the control apparatus 3 generates a function $F1_{ij}$ that defines the relationship between the misalignment amount $dP_{ij}$ and the electrical current amount $A_j$. Here, the misalignment amount $dP_{ij}$ is proportional to the coulomb force acting on the electron beam $EB_i$ from the electron beam $EB_j$. The coulomb force acting on the electron beam $EB_i$ from the electron beam $EB_j$ is proportional to the electrical current amount $A_j$ of the electron beam $EB_j$ (namely, the charge amount of electrons constituting the electron beam $EB_j$). Moreover, when the electrical current amount $A_j$ is zero (namely, the electron beam $EB_j$ is not irradiated), the misalignment amount $dP_{ij}$ is zero understandably. Therefore, it is estimated that a relationship of $dP_{ij}=F1_{ij}(A_j)=K1_{ij} \times A_j$ (note that $K1_{ij}$ is a predetermined coefficient) is satisfied. Thus, as illustrated in FIG. 13, the control apparatus 3 plots the actually measured values including the misalignment amount $dP_{ij\_act}$ and the electrical current amount $A_{j\_set1}$ on a plane of coordinates defining the relationship between the misalignment amount $dP_{ij}$ and the electrical current amount $A_j$. Then, the control apparatus 3 calculates, as the function $F1_{ij}$, a function for defining a straight line that passing through the plotted actually measure values and an origin.

In addition, the coulomb force acting on the electron beam $EB_i$ from the electron beam $EB_j$ is inversely proportional to a square of a distance between the electron beam $EB_i$ and the electron beam $EB_j$ (namely, a square of a distance $D_{ij}$ between the irradiation position $P_1$ and the irradiation position $P_j$). Therefore, the relational equation of $dP_{ij}=F1_{ij}(A_j)=K1_{ij} \times A_j$ varies depending on a variation of the distance $D_{ij}$ (namely, a variation of the irradiation position $P_j$). However, even when the irradiation position $P_j$ varies, the relationship that the misalignment amount $dP_{ij}$ is proportional to the electrical current amount $A_j$ and the misalignment amount $dP_{ij}$ is zero when the electrical current amount $A_j$ is zero never changes. Thus, the relational equation of $dP_{ij}=F1_{ij}(A_j)=K1_{ij} \times A_j$ is displaced up and down depending on the variation of the distance $D_{ij}$ (namely, the variation of the irradiation position $P_j$) with the origin being centered, as illustrated in FIG. 13. Therefore, a function $F2_{ij}$ that defines a relationship among the misalignment amount $dP_{ij}$, the electrical current amount $A_j$ and the irradiation position $P_i$ is generable by the control apparatus 3 on the basis of the read irradiation position $P_j$. Specifically, the function $F2_{ij}$ that defines a relationship of $dP_{ij}=F2_{ij}(A_j, P_j)=(K2_{ij} \times (1/D_{ij}^2)) \times F1_{ij}(A_j)=(K2_{ij} \times (1/D_{ij}^2)) \times (K1_{ij} \times A_j)$ is satisfied (note that $K2_{ij}$ is a coefficient). This relational equation (namely, the function $F2_{ij}$) is used as the position misalignment information $I_{ij}$.

(2-2) Exposure Operation of Wafer W

Figure 14:
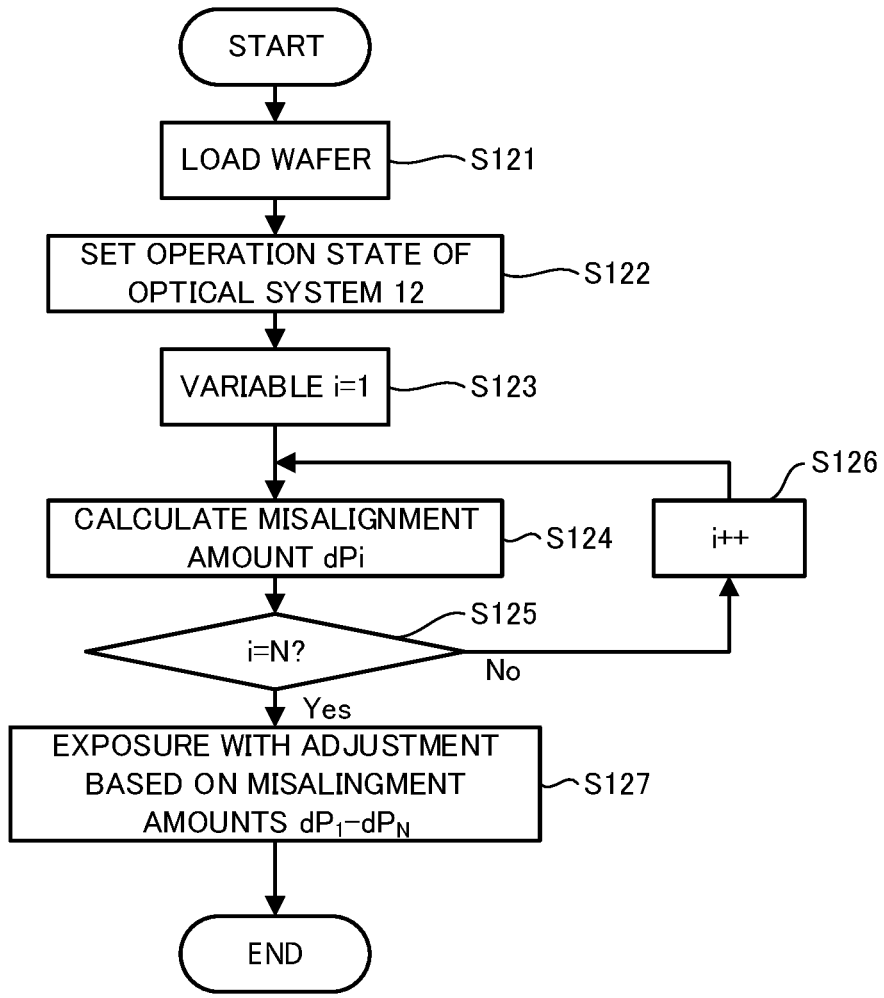
FIG. 14 is a flowchart that illustrates a flow of an exposure operation of a wafer.

Next, with reference to FIG. 14, the exposure operation of the wafer W for drawing (alternatively, transferring) the desired pattern on the wafer W will be described. As illustrated in FIG. 14, firstly, the wafer W is loaded on the exposure apparatus EX (a step S121).

Then, the control apparatus 3 sets the operation state of each of the N electron beam optical systems 12 to a proper operation state for drawing the desired pattern on the wafer W (a step S122).

For example, the control apparatus 3 sets the electrical current amount A of each of the N electron beams EB irradiated by the N electron beam optical systems 12, respectively, to a proper electrical current amount A for drawing the desired pattern on the wafer W. The electrical current amount $A_i$ of the electron beam $EB_i$ is adjustable by setting an operation parameter of the beam optical apparatus 122 (for example, an operation parameter of the electron gun 1221) of the electron beam optical system $12_i$. Therefore, the control apparatus 3 may set the electrical current amount A by setting the operation parameter of the beam optical apparatus 122. Note that the electrical current amount $A_i$ of the electron beam $EB_i$ set at the step S122 is referred to as an "electrical current amount $A_{i\_set2}$".

For example, the control apparatus 3 sets the irradiation position P (namely, the position of the irradiation area EA) of each of the N electron beams EB to a proper irradiation position P for drawing the desired pattern on the wafer W. The irradiation position $P_i$ of the electron beam $EB_i$ is adjustable by the deflector 1222 of the electron beam optical system $12_i$. Therefore, the control apparatus 3 may set the irradiation position P by setting the driving electrical current supplied to the deflector 1222. Note that the irradiation position $P_i$ of the electron beam $EB_i$ set at the step S122 is referred to as an "irradiation position $P_{i\_set2}$".

Then, the control apparatus 3 resets a variable i to 1 (a step S123). In the exposure operation, the variable i is a variable for selecting the electron beam optical system 12 that irradiates the electron beam EB that is the target for calculating the misalignment amount dP.

Then, the control apparatus 3 calculates the misalignment amount $dP_i$ (namely, the misalignment amount from the reference position) of the irradiation area $EA_i$ due to the electron beams $EB_1$ to $EB_N$ (note that the electron beam $EB_i$ is excluded) (a step S124). In order to calculate the misalignment amount $dP_i$, the control apparatus 3 uses the position misalignment information $I_i$ (namely, the position misalignment information $I_{i1}$ to $I_{iN}$) of the position misalignment information I. However, the position misalignment information $I_{ii}$ does not exist and is not used. Specifically, the control apparatus 3 calculates the misalignment amount $dP_{i1}$ of the irradiation area $EA_i$ due to the electron beam $EB_1$ on the basis of the position misalignment information $I_{i1}$ and the electrical current amount $A_{1\_set2}$ and the irradiation position $P_{1\_set2}$ set to the electron beam optical system $12_1$ at the step S122. Similarly, the control apparatus 3 calculates the misalignment amount $dP_{i2}$ of the irradiation area $EA_i$ due to the electron beam $EB_2$ on the basis of the position misalignment information $I_{i2}$ and the electrical current amount $A_{2\_set2}$ and the irradiation position $P_{2\_set2}$ set to the electron beam optical system $12_2$ at the step S122. Subsequently, the control apparatus 3 calculates the misalignment amount $dP_{i3}$, the misalignment amount $dP_{i4}$, . . . , the misalignment amount $dP_{iN-1}$ and the misalignment amount $dP_{iN}$ in a same manner. However, the control apparatus 3 does not calculate the misalignment amount $dP_{ii}$. Then, the control apparatus 3 calculates the misalignment amount $dP_i$ by adding the calculated misalignment amounts $dP_{i1}$ to $dP_{iN}$. Namely, the control apparatus 3 calculates the misalignment amount $dP_i$ on the basis of an equation of $dP_i=dP_{i1}+dP_{i2}+\ldots+dP_{ii-1}+dP_{ii+1}+\ldots+dP_{iN-1}+P_{iN}$.

Then, the control apparatus 3 determines whether or not the variable i is equal to N (a step S125).

As a result of the determination at the step S125, when it is determined that the variable i is not equal to N (the step S125: No), the control apparatus 3 increments the variable i by one (a step S126). Then, the control apparatus 3 executes the processing of the step S124 again. As a result, the misalignment amount $dP_i$ of new irradiation area $EA_i$ is calculated. Namely, a processing for calculating the misalignment amount $dP_i$ of the irradiation area $EA_i$ due to the electron beams $EB_1$ to $EB_N$ (note that the electron beam $EB_i$ is excluded) is repeated by setting the electron beam optical systems $12_1$ to $12_N$ to the electron beam optical system $12_i$ in order.

On the other hand, as a result of the determination at the step S125, when it is determined that the variable i is equal to N (the step S125: Yes), it indicates that all of the calculations of the misalignment amount $dP_1$ to the misalignment amount $dP_N$ are completed. In this case, the control apparatus 3 starts to expose the wafer W (a step S127). In this case, the control apparatus 3 adjusts the irradiation position of each of the electron beams $EB_1$ to $EB_N$ (namely, the position of each of the irradiation areas $EA_1$ to $EA_N$) on the basis of the misalignment amount $dP_1$ to the misalignment amount $dP_N$ calculated at the step S124, in parallel with the exposure of the wafer W (the step S127). The control apparatus 3 adjusts the irradiation position of the electron beam EB along at least one of the X axis direction and the Y axis direction by controlling the deflector 1222, for example. The control apparatus 3 adjusts the irradiation position of the electron beam EB along at least one of the X axis direction and the Y axis direction by controlling a corrector that is different from the deflector 1222 (for example, a corrector included in the beam optical apparatus 122 or a corrector disposed separately from the beam optical apparatus 122), for example.

The misalignment amount $dP_i$ means that the irradiation area $EA_i$ is displaced from the reference position (namely, the position to which the electron beam $EB_i$ should be irradiated) by the misalignment amount $dP_i$ when the N electron beam optical systems 12 irradiate the N electron beams EB, respectively, at a time. Thus, the control apparatus 3 adjusts the position of the irradiation area $EA_i$ to cancel the misalignment amount $dP_i$. Specifically, the control apparatus 3 adjusts the position of the irradiation area $EA_i$ so that the irradiation area $EA_i$ moves by a correction amount $C_i$ that is same amount as the misalignment amount $dP_i$ toward a direction that is opposite to a direction toward which the irradiation area EA is displaced from the reference position. Therefore, the control apparatus 3 may calculate the direction toward which the irradiation area $EA_i$ is displaced in addition to calculating the misalignment amount $dP_i$ when calculating the misalignment amount $dP_i$. Note that the processing at the step S124 for calculating the misalignment amount $dP_i$ of the irradiation area $EA_i$ is equivalent to a processing for calculating the correction amount $C_i$ of the irradiation area $EA_i$, because the correction amount $C_1$ is same amount as the misalignment amount $dP_i$.

Note that there is a possibility that the operation state of at least one of the N electron beam optical system 12 varies during a period when the wafer W is exposed. When the operation state of at least one of the N electron beam optical system 12 varies, there is a possibility that at least one of misalignment amount $dP_1$ to the misalignment amount $dP_N$ also varies. Thus, when the operation state of at least one of the N electron beam optical system 12 varies during the period when the wafer W is exposed, the control apparatus 3 may calculate at least one of misalignment amount $dP_1$ to the misalignment amount $dP_N$ again.

As described above, the exposure apparatus EX in the present embodiment considers the interaction among the plurality of electron beams EB irradiated by the plurality of electron beam optical systems 12, respectively, to expose the wafer W. Namely, the exposure apparatus EX exposes the wafer W and corrects the undesired misalignment (namely, the variation) of the irradiation position of each of the plurality of electron beams EB due to the interaction among the plurality of electron beams EB. Thus, the deterioration of the exposure quality caused by the electron beam EB being irradiated to the position that is different from the position to which the electron beam EB should be irradiated is reduced appropriately.

Moreover, the exposure apparatus EX in the present embodiment calculates the misalignment amount dP of the irradiation position of each of the plurality of electron beams EB due to the interaction among the plurality of electron beams EB by using the position misalignment information I that is generated in advance before the wafer W is exposed. Namely, the interaction among the plurality of electron beams EB is not necessarily calculated in parallel with the exposure of the wafer W. Therefore, the exposure apparatus EX is capable of calculating the misalignment amount dP with a relatively small calculation cost. Thus, the exposure apparatus EX is capable of correcting the misalignment of the irradiation position of each of the plurality of electron beams EB due to the interaction among the plurality of electron beams EB in exposing the wafer W.

Moreover, in the present embodiment, the position misalignment information I is generated on the basis of the result of the test exposure actually executed by the exposure apparatus EX. Thus, the relatively highly accurate position misalignment information I that reflects the result of the actual exposure by the actual exposure apparatus EX is generated. However, the position misalignment information I may be generated by a simulation that simulates the operation of the exposure apparatus EX. Even in this case, the relatively highly accurate position misalignment information I is generated depending on an accuracy of the simulation.

(3) Modified Example

Next, a modified example of the exposure system SYS will be described.

(3-1) First Modified Example

In the above described description, the control apparatus 3 adds all of the misalignment amount $dP_{i1}$ of the irradiation area $EA_i$ due to the electron beam $EB_1$, the misalignment amount $dP_{i2}$ of the irradiation area EA, due to the electron beam $EB_2, \ldots$, and the misalignment amount $dP_{iN}$ of the irradiation area $EA_i$ due to the electron beam $EB_N$ in order to calculate the misalignment amount $dP_i$ of the irradiation area $EA_i$ due to the electron beams $EB_1$ to $EB_N$ (note that the electron beam $EB_i$ is excluded), when the wafer W is exposed. On the other hand, in the first modified example, the control apparatus 3 calculates the misalignment amount $dP_i$ by adding one portion of the misalignment amounts $dP_{i1}$ to $dP_{iN}$. As a result, the calculation cost for calculating the misalignment amount $dP_i$ is reduced, compared to a case where the misalignment amount $dP_i$ is calculated by adding all of the misalignment amounts $dP_{i1}$ to $dP_{iN}$.

The control apparatus 3 extracts at least one misalignment amount $dP_{ik}$ (note that k is an integer value from 1 to N and is different from i) that satisfies a predetermined extraction criterion from the misalignment amounts $dP_{i1}$ to $dP_{iN}$ after calculating the misalignment amounts $dP_{i1}$ to $dP_{iN}$. Then, the control apparatus 3 calculates the misalignment amount $dP_i$ by adding the extracted misalignment amount $dP_{ik}$.

The predetermined extraction criterion may include a first extraction criterion that "the misalignment amount $dP_{ij}$ that is equal to or larger than (or larger than) a predetermined amount is extracted as the misalignment amount $dP_{ik}$ that is to be added to calculate the misalignment amount $dP_i$". For example, the first extraction criterion will be described specifically by using an example illustrated in FIG. 15. FIG. 15 illustrates the misalignment amount $dP_{i,i-12}$ to the misalignment amount $dP_{i,i+12}$ that are calculated to calculate the misalignment amount $dP_i$. Note that the misalignment amount $dP_{ij}$ is described as the "misalignment amount $dP_{i,j}$" in which a comma is inserted between the variable i and the variable j in FIG. 15, for the purpose of clear illustration. In an example illustrated in FIG. 15, the misalignment amount $dP_{i,i-12}$ is 0.01 nm, the misalignment amount $dP_{i,i-11}$ is 0.015 nm, the misalignment amount $dP_{i,i-10}$ is 0.025 nm, the misalignment amount $dP_{i,i-9}$ is 0.01 nm, the misalignment amount $dP_{i,i-8}$ is 0.01 nm, the misalignment amount $dP_{i,i-7}$ is 0.01 nm, the misalignment amount $dP_{i,i-6}$ is 0.1 nm, the misalignment amount $dP_{i,i-5}$ is 0.4 nm, the misalignment amount $dP_{i,i-4}$ is 0.1 nm, the misalignment amount $dP_{i,i-3}$ is 0.015 nm, the misalignment amount $dP_{i,i-2}$ is 0.03 nm, the misalignment amount $dP_{i,i-1}$ is 0.4 nm, the misalignment amount $dP_{i,i+1}$ is 0.4 nm, the misalignment amount $dP_{i,i+2}$ is 0.03 nm, the misalignment amount $dP_{i,i+3}$ is 0.015 nm, the misalignment amount $dP_{i,i+4}$ is 0.1 nm, the misalignment amount $dP_{i,i+5}$ is 0.4 nm, the misalignment amount $dP_{i,i+6}$ is 0.1 nm, the misalignment amount $dP_{i,i+7}$ is 0.015 nm, the misalignment amount $dP_{i,i+8}$ is 0.01 nm, the misalignment amount $dP_{i,i+9}$ is 0.015 nm, the misalignment amount $dP_{i,i+10}$ is 0.03 nm, the misalignment amount $dP_{i,i+11}$ is 0.015 nm and the misalignment amount $dP_{i,i+12}$ is 0.01 nm. When the predetermined amount is "0.02 nm", the control apparatus 3 extracts the misalignment amount $dP_{i,i-10}$, the misalignment amount $dP_{i,i-6}$, the misalignment amount $dP_{i,i-5}$, the misalignment amount $dP_{i,i-4}$, the misalignment amount $dP_{i,i-2}$, the misalignment amount $dP_{i,i-1}$, the misalignment amount $dP_{i,i+1}$, the misalignment amount $dP_{i,i+2}$, the misalignment amount $dP_{i,i+4}$, the misalignment amount $dP_{i,i+5}$, the misalignment amount $dP_{i,i+6}$ and the misalignment amount $dP_{i,i+10}$. Then, the control apparatus 3 calculates the misalignment amount $dP_i$ of "2.115 nm" by adding the extracted misalignment amount $dP_{i,i-10}$, misalignment amount $dP_{i,i-6}$, misalignment amount $dP_{i,i-5}$, misalignment amount $dP_{i,i-4}$, misalignment amount $dP_{i,i-2}$, misalignment amount $dP_{i,i-1}$, misalignment amount $dP_{i,i+1}$, misalignment amount $dP_{i,i+2}$, misalignment amount $dP_{i,i+4}$, misalignment amount $dP_{i,i+5}$, misalignment amount $dP_{i,i+6}$ and misalignment amount $dP_{i,i+10}$.

The predetermined amount that defines the first extraction criterion may be set in advance before the exposure operation of the wafer W is started. Alternatively, the predetermined amount may be set by the control apparatus 3 appropriately during the period when the wafer W is exposed.

The predetermined amount is set from a viewpoint of distinguishing the misalignment amount $dP_{ij}$ by which the exposure quality is maintained or there is small possibility that the exposure quality is affected even when it is not corrected from the misalignment amount $dP_{ij}$ by which the exposure quality is affected or there is high possibility that the exposure quality is affected when it is not corrected, for example. As one example, the predetermined amount may be set on the basis of characteristics of the device that should be manufactured by the exposure operation. For example, when the device is manufactured, an allowable maximum value of a position misalignment of the pattern drawn on the wafer W (namely, an allowable maximum value of the misalignment amount of the irradiation position of the electron beam EB) is set in many cases. The predetermined amount may be set on the basis of this allowable maximum value. For example, as described above, the misalignment amount $dP_i$ is calculated by adding the N−1 misalignment amounts $dP_{i1}$ to $dP_{iN}$. In this case, if each of the misalignment amounts $dP_{i1}$ to $dP_{iN}$ is smaller than a value obtained by dividing the allowable maximum value by N−1, the misalignment amount $dP_i$ is not larger than the allowable maximum value. In other words, the misalignment amount $dP_{ij}$ that is smaller than the value obtained by dividing the allowable maximum value by N−1 is allowed to be regarded as a small misalignment amount that is allowed to be disregarded compared to the allowable maximum value of the position misalignment of the pattern drawn on the wafer W. Thus, the predetermined amount may be the value obtained by dividing the allowable maximum value by N−1 (or a value that is smaller than the divided value), for example.

The predetermined extraction criterion may include a second extraction criterion that "the misalignment amount $dP_{ij}$ due to the electron beam $EB_j$ irradiated to the irradiation area $EA_j$, wherein a distance from the irradiation area $EA_j$ to the irradiation area $EA_i$ is equal to or smaller than a predetermined distance (alternatively, smaller than the predetermined distance), is extracted as the misalignment amount $dP_{ik}$ that is to be added to calculate the misalignment amount $dP_i$. Specifically, as described above, the coulomb force acting between the electron beam $EB_i$ and the electron beam EB (moreover, the misalignment amount $dP_{ij}$ due to this coulomb force) is inversely proportional to the square of the distance $D_{ij}$ between the electron beam $EB_j$ and the electron beam EB (namely, the distance between the irradiation area $EA_i$ and the irradiation area $EA_j$). Therefore, the misalignment amount $dP_{ij}$ becomes smaller as the distance $D_{ij}$ becomes larger. Thus, there is a high possibility that the small misalignment amount $dP_{ij}$ that is allowed to be disregarded (namely, the small misalignment amount $dP_{ij}$ by which the exposure quality is maintained even when it is corrected) corresponds to the misalignment amount $dP_{ij}$ due to the electron beam $EB_j$ corresponding to the relatively large distance $D_{ij}$. Therefore, the second extraction criterion is different from the first extraction criterion that focuses on the quantity of the misalignment amount $dP_{ij}$ itself in that the second extraction criterion focuses on any factor (the distance $D_{ij}$ in this case) that influences the quantity of the misalignment amount $dP_{ij}$. However, the first and second extraction criterions are equivalent to each other in the sense that both are extraction criterions for calculating the misalignment amount $dP_i$ without adding the small misalignment amount $dP_{ij}$ that is allowed to be disregarded.

According to the above described first modified example, an effect that is same as the effect achievable by the above described embodiment is achievable and the calculation cost for calculating the misalignment amount $dP_i$ is reduced (3-2) Second Modified Example In the first modified example, the control apparatus 3 calculates all of the misalignment amounts $dP_{i1}$ to $dP_{iN}$, although the control apparatus 3 adds one portion of the misalignment amounts $dP_{i1}$ to $dP_{iN}$ (namely, the misalignment amount $dP_{ik}$ extracted on the basis of the predetermined extraction criterion) in order to calculate the misalignment amount $dP_i$. On the other hand, in the second modified example, the control apparatus does not calculate all of the misalignment amounts $dP_{i1}$ to $dP_{iN}$. Instead, the control apparatus 3 calculates one portion of the misalignment amounts $dP_{i1}$ to $dP_{iN}$ that should be added to calculate the misalignment amount $dP_i$ (namely, the misalignment amount $dP_{ik}$ extracted on the basis of the predetermined extraction criterion) and does not calculate another portion of the misalignment amounts $dP_{i1}$ to $dP_{iN}$ that are not necessarily added to calculate the misalignment amount $dP_i$ (namely, another misalignment amount $dP_{ij}$ other than the misalignment amount $dP_{ik}$ and it is referred to as a "misalignment amount $dP_{im}$ (note that m is an integer number from 1 to N and is different from i). As a result, the calculation cost for calculating the misalignment amount $dP_i$ is reduced, compared to a case where the misalignment amount $dP_i$ is calculated by calculating all of the misalignment amounts $dP_{i1}$ to $dP_{iN}$.

The control apparatus 3 may select the misalignment amount $dP_{im}$ that is not necessarily added to calculate the misalignment amount $dP_i$ on the basis of the position misalignment information $I_i$. The control apparatus 3 may select the misalignment amount $dP_{ik}$ that should be added to calculate the misalignment amount $dP_i$ on the basis of the position misalignment information $I_i$. Thus, the position misalignment information I may include a first identification information for identifying the misalignment amount $dP_{im}$ that is not necessarily added to calculate the misalignment amount $dP_i$ among the misalignment amounts $dP_{i1}$ to $dP_{iN}$. The position misalignment information I may include a second identification information for identifying the misalignment amount $dP_{ik}$ that should be added to calculate the misalignment amount $dP_i$ among the misalignment amounts $dP_{i1}$ to $dP_{iN}$. The position misalignment information I may include a third identification information for identifying whether each of the misalignment amounts $dP_{i1}$ to $dP_{iN}$ is either one of the misalignment amount $dP_{1k}$ and the misalignment amount $dP_{im}$.

The misalignment amount $dP_{im}$ that is not necessarily calculated and the misalignment amount $dP_{ik}$ that should be calculated may be distinguished from each other from a following viewpoint on the basis of the above described first extraction criterion. Firstly, as described above, the misalignment amount $dP_{ij}$ is calculated on the basis of the position misalignment information $I_{ij}$. Moreover, as described above, the position misalignment information $I_{ij}$ indicates that the misalignment amount $dP_{ij}$ is proportional to the electrical current amount $A_j$ of the electron beam $EB_j$ and is inversely proportional to the square of the distance $D_{ij}$ between the electron beam $EB_i$ and the electron beam $EB_j$. Here, a maximum electrical current amount $A_{j\_max}$ that is allowable as the electrical current amount $A_j$ is usually set by a specification of the exposure apparatus EX. Similarly, an adjustable range the irradiation positions of the electron beam $EB_i$ and the electron beam $EB_j$ (specifically, an adjustable range by the deflector 1222) is also usually set by the specification of the exposure apparatus EX. In this case, the actual electrical current amount $A_j$ is equal to or smaller than the maximum electrical current amount $A_{j\_max}$. Moreover, the actual distance $D_{ij}$ is equal to or larger than a minimum distance $D_{ij\_min}$ determined on the basis of the adjustable range of the irradiation positions of the electron beam $EB_i$ and the electron beam $EB_j$. As a result, as illustrated in FIG. 16A and FIG. 16B each of which illustrates one example of the misalignment amount $dP_{ij}$, the misalignment amount $dP_{ij}$ becomes a maximum misalignment amount $dP_{ij\_max}$ when the electrical current amount $A_j$ becomes the maximum electrical current amount $A_{j\_max}$ and the distance $D_{ij}$ becomes the minimum distance $D_{ij\_min}$.

Figure 16A:
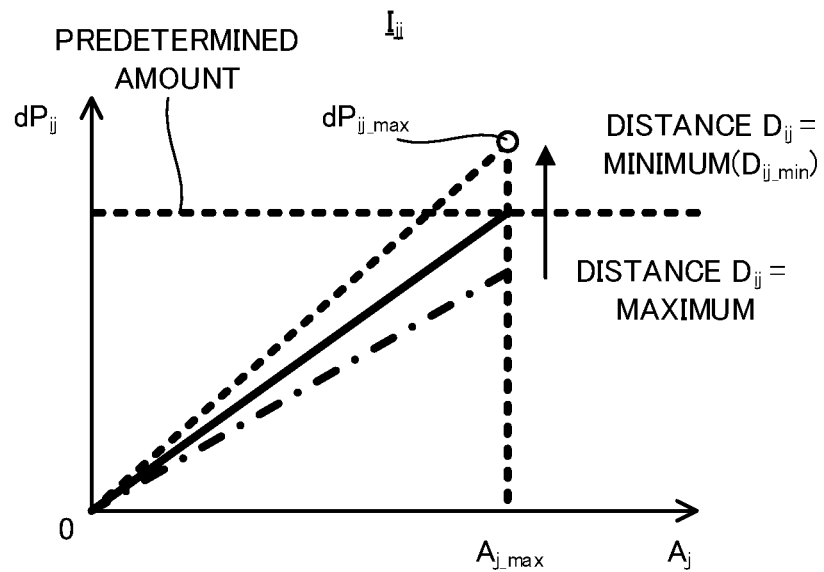
FIG. 16 Each of FIG. 16A
FIG. 16B illustrates a magnitude relationship between a maximum misalignment amount and a predetermined amount on the graph of the function represented by the position misalignment information.
Figure 16B:
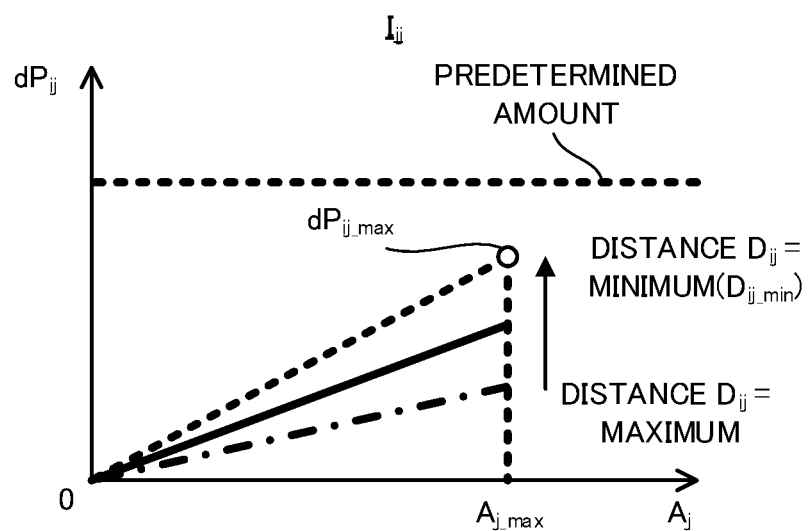

Here, as illustrated in FIG. 16A, when the maximum misalignment amount $dP_{ij\_max}$ is equal to or larger than the predetermined amount that defines the first extraction criterion, there is a possibility that the misalignment amount $dP_{ij}$ is equal to or larger than the predetermined amount depending on the operation state of the electron beam optical system $12_j$. Therefore, there is a possibility that the misalignment amount $dP_{ij}$ is added by the control apparatus 3 as the misalignment amount $dP_{ik}$ that is to be added to calculate the misalignment amount $dP_i$ according to the first extraction criterion. On the other hand, as illustrated in FIG. 16B, when the maximum misalignment amount $dP_{ij\_max}$ is not equal to or larger than the predetermined amount that defines the first extraction criterion, there is no possibility that the misalignment amount $dP_{ij}$ is equal to or larger than the predetermined amount regardless of the operation state of the electron beam optical system $12_j$ irradiating the electron beam $EB_j$. Therefore, the misalignment amount $dP_{ij}$ is not extracted by the control apparatus 3 to calculate the misalignment amount $dP_i$ according to the first extraction criterion.

Therefore, the control apparatus 3 is capable of determining whether the misalignment amount $dP_{ij}$ is the misalignment amount $dP_{ik}$ that should be calculated (namely, added) to calculate the misalignment amount $dP_i$ or the misalignment amount $dP_{im}$ that is not necessarily calculated (namely, added) to calculate the misalignment amount $dP_i$ on the basis of the maximum misalignment amount $dP_{ij\_max}$ that is calculable at a timing when the position misalignment information $I_{ij}$ is generated. Namely, the misalignment amount $dP_{ik}$ that should be calculated and the misalignment amount $dP_{im}$ that is not necessarily calculated are distinguishable from each other by the control apparatus 3 on the basis of the maximum misalignment amount $dP_{ij\_max}$. Moreover, the control apparatus 3 is capable of including at least one of the above described first to third identification information in the position misalignment information $I_{ij}$, because the misalignment amount $dP_{ik}$ and the misalignment amount $dP_{im}$ are distinguishable from each other at a timing when the position misalignment information $I_{ij}$ is generated.

Alternatively, the misalignment amount $dP_{im}$ that is not necessarily calculated and the misalignment amount $dP_{ik}$ that should be calculated may be distinguished from each other from a following viewpoint on the basis of the above described second extraction criterion. Firstly, the arrangement itself of the plurality of electron beam optical systems 12 is fixed. Therefore, whether or not the distance $D_{ij}$ between the electron beam $EB_i$ and the electron beam $EB_j$ (namely, the distance between the irradiation area $EA_i$ and the irradiation area $EA_j$) is determined regardless of the presence or absence of the position alignment information $I_{ij}$. Thus, the misalignment amount $dP_{ik}$ that should be calculated and the misalignment amount $dP_{im}$ that is not necessarily calculated are distinguishable from each other by the control apparatus 3 on the basis of the arrangement itself of the plurality of electron beam optical systems 12 when the position misalignment information $I_{ij}$ is generated. Moreover, the control apparatus 3 is capable of including at least one of the above described first to third identification information in the position misalignment information $I_{ij}$, because the misalignment amount $dP_{ik}$ and the misalignment amount $dP_{im}$ are distinguishable from each other the at a timing when the position misalignment information $I_{ij}$ is generated.

According to the above described second modified example, an effect that is same as the effect achievable by the above described embodiment is achievable and the calculation cost for calculating the misalignment amount $dP_i$ is reduced Note that the position misalignment information $I_i$ may not include the position misalignment information $I_{im}$ when the control apparatus 3 does not calculate the misalignment amount $dP_{im}$ to calculate the misalignment amount $dP_i$. Namely, the control apparatus 3 may generate the position misalignment information $I_i$ that does not include the position misalignment information $I_{im}$. In this case, the fact that the position misalignment information $I_i$ does not include the position misalignment information $I_{im}$ corresponds to the first identification information for identifying the misalignment amount $dP_{im}$ among the misalignment amounts $dP_{i1}$ to $dP_{iN}$. Namely, when the position misalignment information $I_i$ does not include the position misalignment information $I_{ij}$ to calculate the misalignment amount $dP_{ij}$, the control apparatus 3 may determine that the misalignment amount $dP_{ij}$ is not necessarily calculated to calculate the misalignment amount $dP_i$. As a result, the control apparatus 3 does not calculate the misalignment amount $dP_{ij}$. In other words, when the position misalignment information $I_i$ includes the position misalignment information $I_{ij}$ to calculate the misalignment amount $dP_{ij}$, the control apparatus 3 may determine that the misalignment amount $dP_{ij}$ should be calculated to calculate the misalignment amount $dP_i$. As a result, the control apparatus 3 calculates the misalignment amount $dP_{ij}$.

(3-3) Additional Modified Example

The exposure system SYS described with reference to FIG. 1 to FIG. 16 is one example. Therefore, at least one portion of the exposure system SYS may be modified if needed. Next, one example of modification of the exposure system SYS will be described.

In the above described description, the exposure apparatus EX adjusts the position (namely, the position on the wafer W) of each of the irradiation area $EA_1$ to the irradiation area $EA_N$ on the basis of the position misalignment information I generated in advance before the wafer W is exposed, because the calculation cost for sequentially calculating the interaction between the N electron beams EB to adjust the irradiation area $EA_1$ to the irradiation area $EA_N$ becomes huge. However, the exposure apparatus EX may sequentially calculate the position misalignments of all of the irradiation area $EA_1$ to the irradiation area $EA_N$ by sequentially calculating the interaction between the N electron beams EB and adjust the irradiation area $EA_1$ to the irradiation area $EA_N$ on the basis of the calculated result in parallel with the exposure of the wafer W. Especially, when a processing power of the control apparatus 3 is so high that the position misalignments of all of the irradiation area $EA_1$ to the irradiation area $EA_N$ are calculable by sequentially calculating the interaction between the N electron beams EB, the exposure apparatus EX may sequentially calculate the position misalignments of all of the irradiation area $EA_1$ to the irradiation area $EA_N$ in parallel with the exposure of the wafer W.

In the above described description, the control apparatus 3 of the exposure apparatus EX generates the position misalignment information I. However, a control apparatus outside the exposure apparatus EX may generate the position misalignment information I. The outside control apparatus may be integrated with the measurement apparatus for measuring the state of the developed wafer Wt. Alternatively, when the exposure apparatus EX is provided with the measurement apparatus for measuring the state of the developed wafer Wt, a processing for measuring the state of the developed wafer Wt may be executed under the control of the control apparatus 3.

In the above described description, the test exposure (the step S106) by which the electron beam optical system $12_i$ irradiates the electron beam $EB_i$ in the state where the electron beam optical system $12_j$ irradiates the electron beam $EB_j$ is executed one time for every combination of the electron beam optical systems $12_i$ and $12_j$, in order to generate the position misalignment information $I_{ij}$. Therefore, as illustrated in FIG. 13, the position misalignment information $I_{ij}$ is generated on the basis of the single misalignment amount $dP_{ij\_act}$. However, the test exposure by which the electron beam optical system $12_i$ irradiates the electron beam $EB_i$ in the state where the electron beam optical system $12_j$ irradiates the electron beam $EB_j$ is executed a plurality of times for every combination of the electron beam optical systems $12_i$ and $12_j$, in order to generate the position misalignment information $I_{ij}$. In this case, the plurality of test exposures may be executed while varying the operation state of the electron beam optical system $12_j$. As a result, a plurality misalignment amounts $dP_{ij\_act}$ are calculated and the position misalignment information $I_{ij}$ is generated on the basis of the plurality of misalignment amounts $dP_{ij\_act}$.

In the above described description, the function $F2_{ij}$ that is one example of the position misalignment information $I_{ij}$ includes a linear function that defines the relationship between the misalignment amounts $dP_{ij}$ and the electrical current amount $A_j$ (namely, a linear function in which the electrical current amount $A_j$ is a variable). However, the function $F2_{ij}$ may include any function (for example, at least one of a n (note that n is an integer value that is equal to or larger than 2) dimensional function, a fractional function, a logarithmic function, a trigonometric function and an exponent function) that defines the relationship between the misalignment amounts $dP_{ij}$ and the electrical current amount $A_j$.

In the above described description, the function $F2_{ij}$ that is one example of the position misalignment information $I_{ij}$ includes a binary fractional function that defines the relationship between the misalignment amounts $dP_{ij}$ and the irradiation position $P_j$ (specifically, the distance $D_{ij}$ that is unambiguously determined on the basis of the irradiation position $P_j$) (namely, a binary fraction function in which distance $D_{ij}$ is a variable). However, the function $F2_{ij}$ may include any function (for example, at least one of a linear function, a n-dimensional function, a linear fractional function, a fractional of three or more variables, a logarithmic function, a trigonometric function and an exponent function) that defines the relationship between the misalignment amounts $dP_{ij}$ and the irradiation position $P_j$.

In the above described description, the function $F2_{ij}$ is used as one example of the position misalignment information $I_{ij}$. However, the position misalignment information $I_{ij}$ may be any information as long as the position misalignment information $I_{ij}$ indicates the relationship among the misalignment amounts $dP_{ij}$, the electrical current amount $A_j$ and the irradiation position $P_j$. For example, the position misalignment information $I_{ij}$ may include at least one of a table, a graph, a map and a database.

In the above described description, the electrical current amount $A_j$ and the irradiation position $P_j$ are used as examples of the operation state of the electron beam optical system $12_j$ that should be set to calculate the position misalignment information $I_{ij}$. However, any first operation state that likely influences the misalignment amounts $dP_{ij}$ (for example, that likely influences the coulomb force acting between the electron beam $EB_i$ and the electron beam $EB_j$) may be used as the operation state. In this case, the position misalignment information $I_{ij}$ may define a relationship between the misalignment amounts $dP_{ij}$ and the first operation state. Note that the electrical current amount $A_j$ and the irradiation position $P_j$ are examples of the first operation state, because they influence the coulomb force acting between the electron beam $EB_i$ and the electron beam $EB_j$. An electrical current amount of the driving electrical current supplied to each of the pair of first coils and the pair of the second coils constituting the deflector 1222 influences the coulomb force acting between the electron beam $EB_i$ and the electron beam $EB_j$, because the irradiation position $P_j$ of the electron beam $EB_j$ is adjustable thereby. Therefore, the electrical current amount of the driving electrical current supplied to the deflector 1222 is also one example of the first operation state.

Any second operation state that is actively or passively adjustable by the control of the control apparatus 3 may be used as the operation state. In this case, the position misalignment information $I_{ij}$ may define a relationship between the misalignment amounts $dP_{ij}$ and the second operation state. Note that the electrical current amount $A_j$ and the irradiation position $P_j$ are examples of the second operation state, because they are actively or passively adjustable by the control of the control apparatus 3.

The electrical current amount of the driving electrical current supplied to each of the pair of first coils and the pair of the second coils constituting the deflector 1222 is also usable as the second operation state, because it is actively or passively adjustable by the control of the control apparatus 3. Incidentally, when the electrical current amount of the driving electrical current supplied to the deflector 1222 of the electron beam optical system $12_i$ varies, a deflected state of the electron beam $EB_i$ by the deflector 1222 also varies and there is a possibility that the irradiation position $P_i$ of the electron beam $EB_i$ is misaligned unexpectedly.

Any third operation state that is not actively or passively adjustable by the control of the control apparatus 3 and that varies in association with or depending on the control of the control apparatus 3 (in other words, that has a correlation with the control of the control apparatus 3) may be used as the operation state. Especially, the third operation state may be an operation state that has any correlation with the misalignment amounts $dP_{ij}$. In this case, the position misalignment information $I_{ij}$ may define a relationship between the misalignment amounts $dP_{ij}$ and the third operation state. A temperature of the electron beam optical system 12 is one example of the third operation state. When the temperature of the electron beam optical system 12 varies, there is a possibility that the electron beam optical system 12 is distorted, and as a result, there is a possibility that the irradiation position of the electron beam EB is misaligned unexpectedly due to this distortion. Therefore, the temperature of the electron beam optical system 12 has some sort of correlation with the misalignment amounts $dP_{ij}$. Note that the temperature of the electron beam optical system 12 may varies depending on a heat generation of the beam optical apparatus 122 (for example, the electromagnetic lens of the beam optical apparatus 122) operating under the control of the control apparatus 3.

Note that the operation state of such as the temperature of the electron beam optical system 12 that is difficult to be directly measured may be estimated on the basis of the misalignment amounts $dP_{ij}$. In this case, the position misalignment information $I_{ij}$ defines a relationship between the temperature of the electron beam optical system 12 (alternatively, any operation state) and the misalignment amounts $dP_i$ of the electron beam $EB_i$ caused by the temperature.

Any fourth operation state relating to a difference derived from the electron beam optical system 12 may be used as the operation state. In this case, the position misalignment information $I_{ij}$ may define a relationship between the misalignment amounts $dP_{ij}$ and the fourth operation state. An individual difference of a component that constitutes the electron beam optical system 12 (for example, an individual difference of the electromagnetic lens, a shaping diaphragm, an objective lens and the like of the beam optical apparatus 122 and the like) is one example of the fourth operation state. Incidentally, when the control apparatus 3 executes the same control, there is a possibility that the irradiation position of the electron beam EB irradiated by another electron beam optical system 12 is misaligned although the irradiation position of the electron beam EB irradiated by one electron beam optical system 12 is not misaligned, depending on the individual difference of the electron beam optical system 12. Therefore, the fourth operation state is estimated to have some sort of correlation with the misalignment amounts $dP_{ij}$.

In the above described description, the position misalignment information $I_{ij}$ indicates the relationship among the misalignment amounts $dP_{ij}$, the electrical current amount $A_j$ and the irradiation position $P_j$ (namely, the operation state of the electron beam optical system $12_j$). However, the position misalignment information $I_{ij}$ may indicate the relationship among the misalignment amounts $dP_{ij}$, the electrical current amount $A_j$, the irradiation position $P_j$, the electrical current amount $A_i$ and the irradiation position $P_i$ (namely, the operation state of the electron beam optical system $12_i$). This is because there is a possibility that the coulomb force that acts between the electron beam $EB_i$ and the electron beam $EB_j$ and that causes the misalignment amounts $dP_{ij}$ also varies when the electrical current amount $A_i$ and the irradiation position $P_i$ (namely, the distance $D_{ij}$) vary. Here, the relationship that the coulomb force (furthermore, the misalignment amount $dP_{ij}$ due to the coulomb force) is proportional to the electrical current amount $A_i$ and the coulomb force (furthermore, the misalignment amount $dP_{ij}$) is zero when the electrical current amount $A_i$ is zero never changes. The fact that the coulomb force is inversely proportional to the square of the distance between the electron beam $EB_i$ and the electron beam EB (namely, the square of the distance $D_{ij}$ between the irradiation position $P_i$ and the irradiation position $P_i$) also never changes. Thus, the above described relational equation of "$dP_{ij} = F2_{ij}(A_j, P_j) = (K2_{ij} \times (1/D_{ij}^2)) \times (K1_{ij} \times A_j)$" is substitutable by a relational equation of "$dP_{ij} = F3_{ij}(A_j, P_j, A_i, P_i) = (K4_{ij} \times (1/D_{ij}^2)) \times (K3_{ij} \times A_j \times A_i)$" (note that each of $K3_{ij}$ and $K4_{ij}$ is a predetermined coefficient).

In the above described description, the position misalignment information $I_{ij}$ indicates the relationship among the misalignment amounts $dP_{ij}$, the electrical current amount $A_j$ and the irradiation position $P_j$. Here, as described above, the electrical current amount $A_j$ and the irradiation position $P_j$ are parameters that have a relation with the quantity of the coulomb force acting between the electron beam $EB_i$ and the electron beam $EB_j$. On the other hand, the coulomb force acting between the electron beam $EB_i$ and the electron beam $EB_j$ depends on an electric field generated around the electron beam optical system $12_j$ due to the electron beam $EB_j$. In this case, the electrical current amount $A_j$ and the irradiation position $P_j$ are also parameters that determines a quantity of the electric field generated around the electron beam optical system $12_j$ due to the electron beam $EB_j$. Thus, the position misalignment information $I_{ij}$ may indicate the relationship between the misalignment amounts $dP_{ij}$ and the electric field generated around the electron beam optical system $12_j$ due to the electron beam $EB_j$.

The exposure apparatus EX may generate an information that indicates any influence from the electron beam $EB_j$ to the electron beam $EB_i$ and use it during the exposure operation, instead of the position misalignment information $I_{ij}$ indicating the misalignment amounts $dP_{ij}$. For example, an influence that a focus position of the electron beam $EB_i$ varies due to the electron beam $EB_j$ is one example of the influence from the electron beam $EB_j$ to the electron beam $EB_i$. In this case, the exposure apparatus EX may generate an information that indicates a relationship between an misalignment amount of the focus position of the electron beam $EB_i$ and the operation state of the electron beam optical system $12_j$ and adjust the focus position of the electron beam $EB_i$ on the basis of this information. The focus position is adjustable by a corrector including a coil for a focus control of the electron beam optical system $12_i$. For example, an influence that an irradiation amount (namely, substantially corresponding to the electrical current amount) of the electron beam $EB_i$ varies due to the electron beam $EB_j$ is one example of the influence from the electron beam $EB_j$ to the electron beam $EB_i$. In this case, the exposure apparatus EX may generate an information that indicates a relationship between a varied amount of the irradiation amount of the electron beam $EB_i$ and the operation state of the electron beam optical system $12_j$ and adjust the irradiation amount of the electron beam $EB_i$ on the basis of this information.

In the above described description, the exposure system SYS is provided with the exposure apparatus EX that is configured to irradiate the wafer W with the electron beam EB to expose the wafer. W. However, the exposure system SYS may be provided with an exposure apparatus EX that is configured to irradiate the wafer W with any charged particle beam (for example, an ion beam) different from the electron beam EB to expose the wafer. W.

In the above described description, the exposure apparatus EX is a single-beam-type of exposure apparatus in which each electron beam optical system 12 uses the single electron beam EB to draw or transfer the pattern on the wafer W. In this case, the exposure apparatus EX may be a variable-shape-type of exposure apparatus in which each electron beam optical system 12 shapes the cross-sectional plane of the electron beam EB irradiated to the wafer W into the quadrangular shape having a variable size. However, the exposure apparatus EX may be a point-beam-type of exposure apparatus in which each electron beam optical system 12 irradiates the wafer W with the electron beam EB having a spot shape. The exposure apparatus EX may be a stencil-mask-type of exposure apparatus in which each electron beam optical system 12 shapes the electron beam EB into a desired shape by using a stencil mask at which a beam passing hole having a desired shape is formed.

Alternatively, the exposure apparatus EX may be a multi-beam-type of exposure apparatus in which each electron beam optical system 12 uses a plurality of electron beams to draw or transfer the pattern on the wafer W. For example, the exposure apparatus EX may be an exposure apparatus that is configured to draw the pattern on the wafer W by generating the plurality of electron beams through a blanking aperture array having a plurality of apertures and turning on/off the plurality of electron beams independently on the basis of drawn pattern. For example, the exposure apparatus EX may be an exposure apparatus in which each electron beam optical system 12 is provided with a surface-emission-type of electron beam source having a plurality of electron emission parts that emit the plurality of electron beams, respectively.

Alternatively, the exposure apparatus EX may be configured to irradiate the plurality of electron beams EB irradiated by the plurality of electron beam optical systems 12 without having the plurality of electron beam optical systems 12. For example, when the exposure apparatus EX is exposure apparatus that is provided with the surface-emission-type of electron beam source having the plurality of electron emission parts that emit the plurality of electron beams, respectively, the plurality of electron beams emitted from the plurality of electron emission parts correspond to the plurality of electron beams EB irradiated by the plurality of electron beam optical systems 12. Even in this case, the above described technical effect is achieved as long as the interaction among the plurality of electron beams is considered as described above.

The exposure apparatus EX may be a collective-transfer-type of exposure apparatus that is configured to collectively transfer the pattern of one semiconductor chip or the pattern of a plurality of semiconductor chips from a mask to the wafer W. The exposure apparatus EX may be a divided-transfer-type of exposure apparatus that is configured to perform the exposure with a through-put higher than the collective-transfer-type. The divided-transfer-type of exposure apparatus is configured to divide the pattern that is transferred to the wafer W into a plurality of small areas smaller than a size corresponding to one shot area S on a mask and transfer the patterns of the plurality of small areas to the wafer W. Note that there is a reduction-transfer-type of exposure apparatus that is configured to irradiate the electron beam EB to a certain area of a mask having the pattern of one semiconductor chip and reduction-transfer an image of the pattern of the area to which the electron beam EB is irradiated by a projection lens, as the divided-transfer-type of exposure apparatus.

The exposure apparatus EX may be a scanning stepper. The exposure apparatus EX may be a static exposure apparatus such as a stepper. The exposure apparatus EX may be a reduction projection exposure apparatus of a step-and-stitch method that is configured to synthesize at least one portion of one shot area S and at least one portion of another shot area S.

In the above described description, the wafer W is transported in the exposure system SYS in a state where the wafer W is held by the shuttle SHL. However, the wafer W may be transported in the exposure system SYS alone (namely, in a state where the wafer W is not held by the shuttle SHL).

In the above described description, the barrel 11 is suspended and supported by the metrology frame 13 in the electron beam irradiation apparatus 1. However, the barrel 11 may be disposed on a floor in the electron beam irradiation apparatus 1. For example, the barrel 11 may be supported by a bottom surface of the outer frame F (alternatively, a body disposed on the floor) from below. In this case, the electron beam irradiation apparatus 1 may not be provided with the metrology frame 13.

In the above described description, an exposed target for the exposure system SYS is the semiconductor substrate (namely, the wafer W) for manufacturing the semiconductor device. However, the exposed target for the exposure system SYS may be any substrate. For example, the exposure system SYS may be an exposure system for manufacturing an organic electro-luminescence, a thin film magnetic head, an imaging element (CCD and the like), a micro machine or a DNA chip. For example, the exposure system SYS may be an exposure system for drawing a mask pattern on a squared-shaped glass plate or a silicon wafer.

In the above described description, the exposure system SYS is provided with the plurality of exposure apparatuses EX. However, the exposure system SYS may be provided with single exposure apparatus EX instead of the plurality of exposure apparatuses EX. In the above described description, the exposure apparatuses EX1 to EX10 are arranged in two rows in the exposure system SYS. However, the plurality of exposure apparatuses EX may be arranged in a row in the exposure system SYS. Alternatively, the plurality of exposure apparatuses EX may be arranged in three or more rows in the exposure system SYS.

Figure 17:
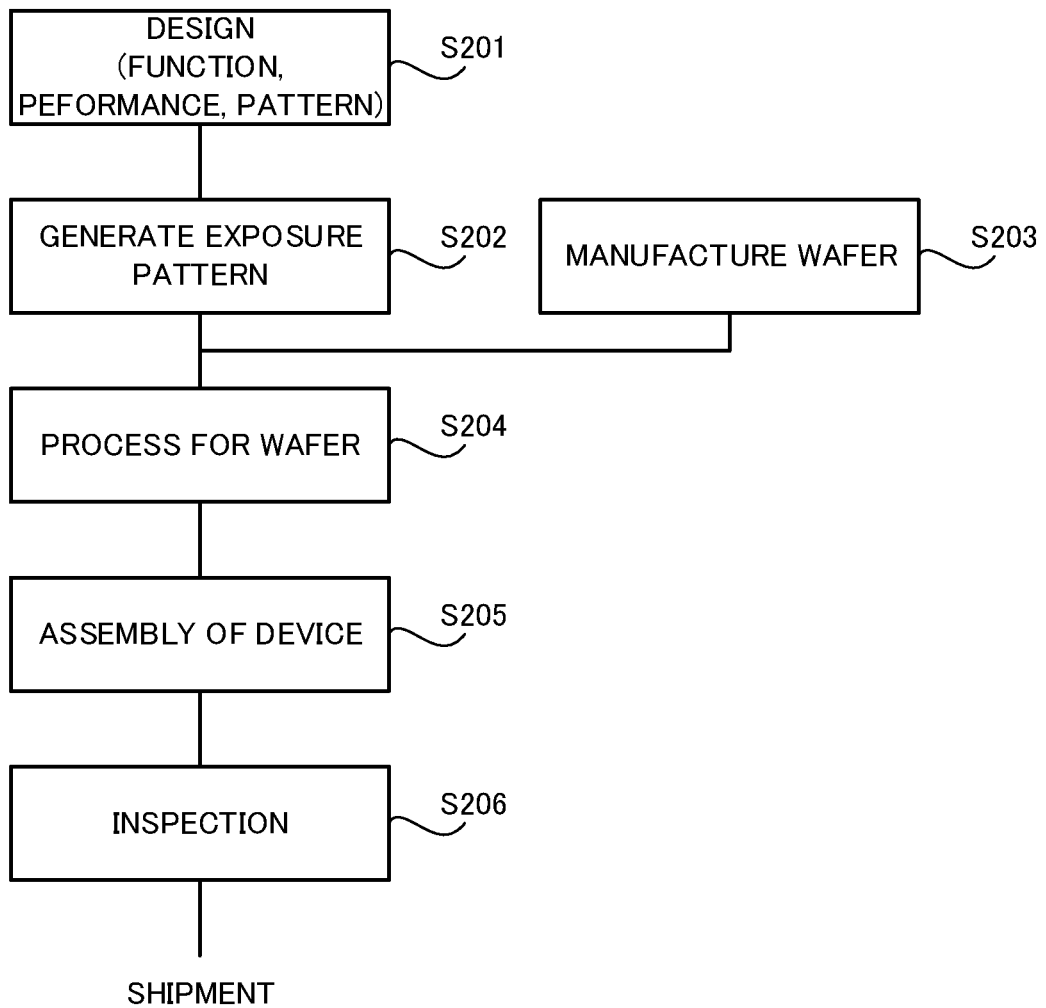
FIG. 17 is a flowchart that illustrates a flow of a device manufacturing method.

A device such as the semiconductor device may be manufactured through each step illustrated in FIG. 17. Steps for manufacturing the device may include a step S201 at which function and performance of the device is designed, a step S202 at which an exposure pattern based on the designed function and performance (namely, an exposure pattern by the electron beam EB) is generated, a step S203 at which the wafer W which is the base material of the device is manufactured, a step S204 at which the wafer W is exposed by the electron beam EB based on the generated exposure pattern and the exposed wafer W is developed, a step S205 including a device assembling process (a processing process such as a dicing process, a bonding process, a packaging process and the like) and an inspection step S206 at which the device is inspected.

At least one portion of the aspect of each embodiment (including each modified example, same applies to this paragraph) described above may be appropriately combined with at least another one portion of the aspect of each embodiment described above. One portion of the aspect of each embodiment described above may not be used. Moreover, the disclosures of all publications and United States patents that are cited in each embodiment described above are incorporated in the disclosures of the present application by reference if it is legally permitted.

The present invention is not limited to the above described embodiment. The present invention can be changed, if desired, without departing from the essence or spirit of the invention that can be read from the claims and the entire specification. A charged particle beam optical apparatus, an exposure apparatus, an exposure method, a control apparatus, a control method, an information generation apparatus, an information generation method and a device manufacturing method, which involve such changes, are also intended to be within the technical scope of the present invention.

DESCRIPTION OF REFERENCE CODES

SYS exposure system
EX exposure apparatus
ALG alignment apparatus
W wafer
SHL shuttle
EB electron beam
EA irradiation area
dP misalignment amount
A electrical current amount of electron beam
P irradiation position of electron beam
S shot area
1 electron beam irradiation apparatus
11 barrel
12 electron beam optical system
2 stage apparatus
3 control apparatus

The invention claimed is:

1. A charged particle beam optical apparatus that is configured to irradiate an object with a charged particle beam,
the charged particle beam optical apparatus comprising:
a plurality of irradiation optical systems each of which is configured to irradiate the object with the charged particle beam; and
a first control apparatus that is configured to control, on the basis of an operation state of at least one first irradiation optical system of the plurality of irradiation optical systems, a second irradiation optical system of the plurality of irradiation optical systems that is different from the first irradiation optical system.

2. The charged particle beam optical apparatus according to claim 1, wherein
the operation state includes at least one of a first irradiation state of the charged particle beam irradiated by the first irradiation optical system and a temperature of the first irradiation optical system.

3. The charged particle beam optical apparatus according to claim 1, wherein
the first irradiation optical system has a deflector that is configured to deflect the charged particle beam,
the operation state includes an amount of an electrical current that is supplied to the deflector.

4. The charged particle beam optical apparatus according to claim 1, wherein
the first control apparatus is configured to adjust a second irradiation state of the charged particle beam irradiated by the second irradiation optical system on the basis of the operation state of the first irradiation optical system.

5. The charged particle beam optical apparatus according to claim 4, wherein
the first and second irradiation states include at least one of an irradiation position of the charged particle beam, a focus position of the charged particle beam, and an irradiated amount of the charged particle beam.

6. The charged particle beam optical apparatus according to claim 1, wherein
the first control apparatus has:
a first calculating part that is configured to calculate a variation information relating to a variation of a second irradiation state of the charged particle beam irradiated by the second irradiation optical system, the variation is caused by the operation state of the first irradiation optical system; and a first controlling part that is configured to control the second irradiation optical system on the basis of the variation information calculated by the first calculating part.

7. The charged particle beam optical apparatus according to claim 6, wherein
the variation information includes a relationship between the operation state and the second irradiation state at the operation state.

8. The charged particle beam optical apparatus according to claim 6, wherein
the operation state includes an ON state at which the first irradiation optical system irradiates the object with the charged particle beam and an OFF state at which the first irradiation optical system does not irradiate the object with the charged particle beam,
the second irradiation state includes a state at which the second irradiation optical system irradiates the object with the charged particle beam when the first irradiation optical system is in the ON state.

9. The charged particle beam optical apparatus according to claim 6, wherein
the second irradiation optical system is configured to irradiate the object with the charged particle beam,
the variation information is generated on the basis of a measurement result of measuring the second irradiation state of the charged particle beam irradiated to the object.

10. The charged particle beam optical apparatus according to claim 9, wherein
the first control apparatus is configured to estimate the operation state of the first irradiation optical system on the basis of the measurement result,
the variation information includes a relationship between the estimated operation state and the second irradiation state at the estimated operation state.

11. The charged particle beam optical apparatus according to claim 1, wherein
the first control apparatus has:
a second calculating part that is configured to calculate a variation information relating to a variation of an electric field around the second irradiation optical system, the variation is caused by the operation state of the first irradiation optical system; and
a first controlling part that is configured to control the second irradiation optical system on the basis of the variation information calculated by the second calculating part.

12. The charged particle beam optical apparatus according to claim 1, wherein
the first control apparatus is configured to control the second irradiation optical system on the basis of the operation state of each of many first irradiation optical systems other than the second irradiation optical system among the plurality of irradiation optical systems.

13. The charged particle beam optical apparatus according to claim 12, wherein
the first control apparatus has:
a third calculating part that is configured to calculate a variation information relating to a variation of a second irradiation state of the charged particle beam irradiated by the second irradiation optical system, the variation is caused by the operation state of each of the many first irradiation optical systems; and a second controlling part that is configured to control the second irradiation optical system on the basis of the variation information calculated by the third calculating part.

14. The charged particle beam optical apparatus according to claim 13, wherein
the third calculating part is configured to separately calculate the variation information relating to the variations of the second irradiation states caused by the operation states of the many first irradiation optical systems, respectively,
the second controlling part is configured to control the second irradiation optical system on the basis of a result of combining the separately calculated variation information.

15. The charged particle beam optical apparatus according to claim 13, wherein
the third calculating part is configured to separately calculate the variation information relating to the variations of the second irradiation states caused by the operation states of the many first irradiation optical systems, respectively,
the second controlling part is configured to control the second irradiation optical system on the basis of a result of combining the variation information that is equal to or larger than a predetermined value among the separately calculated variation information.

16. The charged particle beam optical apparatus according to claim 13, wherein
the third calculating part is configured to separately calculate the variation information relating to the variations of the second irradiation states caused by the operation states of the many first irradiation optical systems, respectively,
the second controlling part is configured to control the second irradiation optical system on the basis of a result of combining one portion of the separately calculated variation information.

17. The charged particle beam optical apparatus according to claim 12, wherein
the many first irradiation optical systems are everything except for the second irradiation optical system of the plurality of irradiation optical systems.

18. The charged particle beam optical apparatus according to claim 1, wherein
each of the plurality of irradiation optical systems includes a beam shaping member having a plurality of apertures,
the operation state includes a transmittance of the charged particle beam that passes through the plurality of apertures.

19. The charged particle beam optical apparatus according to claim 1, wherein
the operation state includes a difference derived from the first irradiation optical system.

20. An exposure apparatus comprising the charged particle beam optical apparatus according to claim 1.

21. An exposure method of exposing the object by using the exposure apparatus according to claim 20.

22. A device manufacturing method comprising a lithography step,
the object being exposed by the exposure method according to claim 21 in the lithography step.

23. An information generation apparatus comprising a second control apparatus that is configured to generate the control information used by the charged particle beam optical apparatus according to claim 1 to control the second irradiation optical system.

24. The information generation apparatus according to claim 23, wherein
the control information includes a variation information relating to a variation of an irradiation state of the charged particle beam irradiated by the second irradiation optical system, the variation is caused by the operation state of the first irradiation optical system.

25. The information generation apparatus according to claim 24, wherein
the second control apparatus is configured to control the charged particle beam apparatus so that the second irradiation optical system irradiates the object with the charged particle beam in a condition where the first irradiation optical system in a predetermined operation state actually irradiates the object with the charged particle beam,
the second control apparatus is configured to generate the variation information on the basis of a measurement result of measuring the irradiation state of the charged particle beam irradiated to the object.

26. The information generation apparatus according to claim 25, wherein
the second control apparatus is configured to generate the variation information by estimating a relationship between the operation state and the irradiation state at the operation state from the measurement result.

27. The information generation apparatus according to claim 25 wherein
the second control apparatus is configured to control the charged particle beam apparatus to repeat an operation while varying the operation state, the operation allows the second irradiation optical system to irradiate the object with the charged particle beam in the condition where the first irradiation optical system in a predetermined operation state actually irradiates the object with the charged particle beam.

28. The information generation apparatus according to claim 25, wherein
the variation information is an information relating to the variation of the irradiation state caused by the operation state of each of many first irradiation optical systems other than the second irradiation optical system among the plurality of irradiation optical systems,
the second control apparatus is configured to control the charged particle beam apparatus to repeat an operation while setting each of the first irradiation optical systems to one first irradiation optical system in order, the operation allows which the second irradiation optical system to irradiate the object with the charged particle beam in a condition where the one first irradiation optical system of the first irradiation optical systems actually irradiates the object with the charged particle beam in one operation state and the another first irradiation optical system other than the one first irradiation optical system of the first irradiation optical systems does not irradiate the object with the charged particle beam.

29. An information generation method of generating the control information used by the charged particle beam optical apparatus according to claim 1 to control the second irradiation optical system.

30. An exposure method of exposing an object by irradiating a charged particle beam,
the exposure method including:
irradiating the object with the charged particle beam through each of a plurality of irradiation optical systems; and
controlling, on the basis of an operation state of at least one first irradiation optical system of the plurality of irradiation optical systems, a second irradiation optical system of the plurality of irradiation optical systems that is different from the first irradiation optical system.

31. A control apparatus for controlling a charged particle beam optical apparatus that is configured to irradiate an object with a charged particle beam from each of a plurality of irradiation optical systems,
the control apparatus being configured to control, on the basis of an operation state of at least one first irradiation optical system of the plurality of irradiation optical systems, a second irradiation optical system of the plurality of irradiation optical systems that is different from the first irradiation optical system.

32. A control method of controlling a charged particle beam optical apparatus that is configured to irradiate an object with a charged particle beam from each of a plurality of irradiation optical systems,
the control method including controlling, on the basis of an operation state of at least one first irradiation optical system of the plurality of irradiation optical systems, a second irradiation optical system of the plurality of irradiation optical systems that is different from the first irradiation optical system.

\* \* \* \* \*